(12) United States Patent
Laurent et al.

(10) Patent No.: US 10,481,502 B2
(45) Date of Patent: **\*Nov. 19, 2019**

(54) OBJECT HOLDER AND LITHOGRAPHIC APPARATUS

(71) Applicant: ASML Netherlands B.V., Veldhoven (NL)

(72) Inventors: Thibault Simon Mathieu Laurent, Eindhoven (NL); Johannes Henricus Wilhelmus Jacobs, Heeze (NL); Wilhelmus Franciscus Johannes Simons, Beesel (NL); Martijn Houben, 's-Hertogenbosch (NL); Raymond Wilhelmus Louis Lafarre, Helmond (NL); Koen Steffens, Veldhoven (NL); Han Henricus Aldegonda Lempens, Weert (NL); Rogier Hendrikus Magdalena Cortie, Ittervoort (NL); Ruud Hendrikus Martinus Johannes Bloks, Helmond (NL); Gerben Pieterse, Eindhoven (NL); Siegfried Alexander Tromp, Papendrecht (NL); Theodorus Wilhelmus Polet, Grave (NL); Jim Vincent Overkamp, Eindhoven (NL); Van Vuong Vy, Eindhoven (NL)

(73) Assignee: ASML NETHERLANDS B.V., Veldhoven (NL)

( \* ) Notice: Subject to any disclaimer, the term of this patent is extended or adjusted under 35 U.S.C. 154(b) by 0 days.

This patent is subject to a terminal disclaimer.

(21) Appl. No.: 15/918,478

(22) Filed: Mar. 12, 2018

(65) Prior Publication Data

US 2018/0267412 A1 Sep. 20, 2018

Related U.S. Application Data

(63) Continuation of application No. 15/629,399, filed on Jun. 21, 2017, now Pat. No. 9,915,877, which is a
(Continued)

(51) Int. Cl.
*G03F 7/20* (2006.01)
*H01L 21/68* (2006.01)

(52) U.S. Cl.
CPC ........ *G03F 7/70341* (2013.01); *G03F 7/7095* (2013.01); *G03F 7/70716* (2013.01); *G03F 7/70875* (2013.01); *H01L 21/682* (2013.01)

(58) Field of Classification Search
CPC ............. G03F 7/70341; G03F 7/70716; G03F 7/70875; G03F 7/7095
(Continued)

(56) References Cited

U.S. PATENT DOCUMENTS

| 4,509,852 A | 4/1985 | Tabarelli et al. |
| 7,199,858 B2 | 4/2007 | Lof et al. |

(Continued)

FOREIGN PATENT DOCUMENTS

| CN | 1501175 | 6/2004 |
| CN | 1737690 | 2/2006 |

(Continued)

OTHER PUBLICATIONS

International Search Report dated Oct. 28, 2013 in corresponding International Patent Application No. PCT/EP2013/059437.
(Continued)

*Primary Examiner* — Colin W Kreutzer
(74) *Attorney, Agent, or Firm* — Pillsbury Winthrop Shaw Pittman, LLP

(57) ABSTRACT

An object table to support an object, the object table having a support body, an object holder to hold an object, an
(Continued)

opening adjacent an edge of the object holder, and a channel in fluid communication with the opening via a passageway, wherein the channel is defined by a first material which is different to a second material defining the passageway.

20 Claims, 13 Drawing Sheets

Related U.S. Application Data continuation of application No. 14/399,137, filed as application No. PCT/EP2013/059437 on May 7, 2013, now Pat. No. 9,785,055.

(60) Provisional application No. 61/744,740, filed on Oct. 3, 2012, provisional application No. 61/709,030, filed on Oct. 2, 2012, provisional application No. 61/652,602, filed on May 29, 2012.

(58) Field of Classification Search
USPC .................................. 310/12.06; 355/30, 72
See application file for complete search history.

(56) References Cited

U.S. PATENT DOCUMENTS

| | | | |
|---|---|---|---|
| 7,213,963 | B2 | 5/2007 | Lof et al. |
| 7,433,016 | B2 | 10/2008 | Streefkerk et al. |
| 7,649,611 | B2 | 1/2010 | Zaal et al. |
| 7,652,746 | B2 | 1/2010 | Jacobs et al. |
| 7,701,550 | B2 | 4/2010 | Kemper et al. |
| 7,705,962 | B2 | 4/2010 | Kemper et al. |
| 7,751,027 | B2 | 7/2010 | Jacobs et al. |
| 7,791,709 | B2 | 9/2010 | Hennus et al. |
| 7,804,575 | B2 | 9/2010 | Cadee et al. |
| 8,027,019 | B2 | 9/2011 | Kemper et al. |
| 8,274,641 | B2 | 9/2012 | Mondt et al. |
| 8,472,003 | B2 | 6/2013 | Patel et al. |
| 8,514,365 | B2 | 8/2013 | De Jong et al. |
| 8,547,523 | B2 | 10/2013 | Riepen et al. |
| 8,564,763 | B2 | 10/2013 | Jacobs et al. |
| 8,610,089 | B2 | 12/2013 | Donders et al. |
| 8,836,912 | B2 | 9/2014 | Bessems et al. |
| 9,785,055 | B2 * | 10/2017 | Laurent ............... G03F 7/70341 |
| 9,915,877 | B2 * | 3/2018 | Laurent ............... G03F 7/70341 |
| 2004/0160582 | A1 | 8/2004 | Lof et al. |
| 2004/0207824 | A1 | 10/2004 | Lof et al. |
| 2005/0115947 | A1 | 6/2005 | Hosokawa |
| 2005/0264778 | A1 | 12/2005 | Lof et al. |
| 2006/0038968 | A1 | 2/2006 | Kemper et al. |
| 2006/0158627 | A1 | 7/2006 | Kemper et al. |
| 2006/0238730 | A1 | 10/2006 | Nei |
| 2006/0250590 | A1 | 11/2006 | Streefkerk et al. |
| 2007/0153244 | A1 | 7/2007 | Zaal et al. |
| 2007/0177125 | A1 | 8/2007 | Shibazaki |
| 2007/0229786 | A1 | 10/2007 | Kemper et al. |
| 2007/0229787 | A1 | 10/2007 | Emoto |
| 2008/0043210 | A1 | 2/2008 | Shibuta |
| 2008/0043211 | A1 * | 2/2008 | Poon ..................... G03B 27/42 355/30 |
| 2008/0106707 | A1 | 5/2008 | Kobayashi |
| 2008/0137055 | A1 | 6/2008 | Hennus et al. |
| 2008/0158526 | A1 | 7/2008 | Hennus et al. |
| 2008/0198346 | A1 | 8/2008 | Iimura |
| 2008/0212046 | A1 | 9/2008 | Riepen et al. |
| 2008/0297744 | A1 | 12/2008 | De Jong et al. |
| 2008/0297751 | A1 | 12/2008 | Shibazaki |
| 2009/0115977 | A1 | 5/2009 | Nagasaka |
| 2009/0279060 | A1 | 11/2009 | Direcks et al. |
| 2009/0279061 | A1 | 11/2009 | Jacobs et al. |
| 2009/0279062 | A1 | 11/2009 | Direcks et al. |
| 2009/0296056 | A1 | 12/2009 | Mondt et al. |
| 2009/0296068 | A1 | 12/2009 | Castelijns |
| 2010/0245791 | A1 | 9/2010 | Jacobs et al. |
| 2010/0313974 | A1 | 12/2010 | Riepen et al. |
| 2011/0005603 | A1 | 1/2011 | Patel et al. |
| 2011/0181849 | A1 | 7/2011 | Patel et al. |
| 2011/0222033 | A1 | 9/2011 | Ten Kate et al. |
| 2011/0267590 | A1 | 11/2011 | Rodak |
| 2012/0120376 | A1 | 5/2012 | Bessems et al. |
| 2012/0154781 | A1 | 6/2012 | Ten Kate et al. |
| 2013/0045447 | A1 | 2/2013 | Kunnen et al. |
| 2013/0094005 | A1 | 4/2013 | Kunnen et al. |
| 2015/0131064 | A1 | 5/2015 | Laurent et al. |

FOREIGN PATENT DOCUMENTS

| | | |
|---|---|---|
| CN | 1894773 | 1/2007 |
| CN | 101046640 | 10/2007 |
| CN | 101598906 | 12/2009 |
| CN | 102193332 | 9/2011 |
| EP | 1 420 298 | 5/2004 |
| EP | 1 628 163 | 2/2006 |
| JP | H07-273175 | 10/1995 |
| JP | 2005-005707 | 1/2005 |
| JP | 2006054427 A | 2/2006 |
| JP | 2006-060223 | 3/2006 |
| JP | 2007515799 | 6/2007 |
| JP | 2007-266603 | 10/2007 |
| JP | 2007266504 A | 10/2007 |
| JP | 2008172214 | 7/2008 |
| JP | 2008300829 A | 12/2008 |
| JP | 2009043879 | 2/2009 |
| JP | 2009295979 A | 12/2009 |
| JP | 2011151397 | 8/2011 |
| JP | 2011-192991 | 9/2011 |
| JP | 2011258965 A | 12/2011 |
| JP | 2014-187213 | 10/2014 |
| KR | 10-2007-0107935 | 11/2007 |
| WO | 99/49504 | 9/1999 |
| WO | 2013/178484 | 12/2013 |
| WO | 2015/188988 | 12/2015 |

OTHER PUBLICATIONS

Japanese Office Action dated Sep. 11, 2015 in corresponding Japanese Patent Application No. 2015-514401.
Japanese Notice of Reasons for Rejection dated Jul. 4, 2017 in corresponding Japanese Patent Application No. 2016-175225.
Japanese Office Action issued in Japanese Patent Application No. 2018-070728, dated Mar. 11, 2019.

\* cited by examiner

OBJECT HOLDER AND LITHOGRAPHIC APPARATUS

CROSS-REFERENCE TO RELATED APPLICATIONS

This application is a continuation of U.S. patent application Ser. No. 15/629,399, filed Jun. 21, 2017, which is a continuation of U.S. patent application Ser. No. 14/399,137, filed Nov. 5, 2014, which is the U.S. national phase entry of PCT patent application no. PCT/EP2013/059437, which was filed on May 7, 2013, which claims the benefit of priority of U.S. provisional application No. 61/652,602, which was filed on 29 May 2012, and U.S. provisional application 61/744,740, which was filed on 3 Oct. 2012, and which are each incorporated herein in its entirety by reference, and which claims the benefit of priority of U.S. provisional application No. 61/709,030, which was filed on 2 Oct. 2012.

FIELD

The present invention relates to an object holder, a lithographic apparatus and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, device structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

Handling immersion liquid in a lithographic apparatus brings with it one or more problems of liquid handling. A gap normally exists between an object, such as a substrate and/or a sensor, and a table (e.g. a substrate table or a measurement table) around the edge of the object (e.g., substrate and/or sensor). U.S. patent application publication US 2005-0264778, discloses filling that gap with material or providing a liquid source or low pressure source to deliberately fill the gap with liquid in order to avoid bubble inclusion as the gap passes under the liquid supply system and/or to remove any liquid which does enter the gap.

SUMMARY

It is desirable, for example, to provide for removal of liquid from a gap between an edge of an object and a table on which the object is positioned. The object may be a substrate, a sensor, a closing plate, etc.

According to an aspect, there is provided an object table to support an object, comprising: a support body comprising an object holder to hold an object; an opening adjacent an edge of the object holder; and a channel in fluid communication with the opening via a passageway, wherein the channel is defined by a first material which is different to a second material defining the passageway.

According to an aspect, there is provided a method of operating an immersion lithographic apparatus, comprising: providing a liquid onto an object supported by a table; and removing liquid from an edge of the object through an opening in fluid communication with a channel via a passageway, wherein the channel is defined by a first material which is different to a second material which defines the passageway.

According to an aspect, there is provided an object table to support an object, the object table comprising: a support body comprising an object holder to hold an object; a channel in fluid communication with an opening which is adjacent an edge of the object holder and extending along at least part of an outer edge of the object holder; and a liquid retainer in the channel to retain liquid in the channel, the liquid retainer comprising an indentation defined on, or a projection or element present at, a bottom of the channel.

According to an aspect, there is provided an object table to support an object, the object table comprising: a support body comprising an object holder to hold an object; a channel in fluid communication with an opening which is adjacent an edge of the object holder and extending along at least part of an outer edge of the object holder; and a liquid retainer in the channel to retain liquid in the channel, the liquid retainer comprising a projection or element at least partly blocking passage of liquid along the channel in a direction in which the channel is elongate.

According to an aspect, there is provided an object table to support an object, the object table comprising: a support body comprising an object holder to hold an object; a channel in fluid communication with an opening which is adjacent an edge of the object holder and extending along at least part of an outer edge of the object holder; and a liquid retainer in the channel to retain liquid in the channel, the liquid retainer comprising "an indentation defined on, or a projection or element present at, a side wall of the channel.

According to an aspect, there is provided a method of operating an immersion lithographic apparatus, comprising: providing a liquid onto an object supported by a table; and removing liquid from an edge of the object through a channel which extends along at least part of an edge of the object, wherein liquid is provided to the channel from a thermal conditioning fluid passageway in the table.

According to an aspect, there is provided a method of operating an immersion lithographic apparatus, comprising: providing a liquid onto an object supported by a table; and removing liquid from an edge of the object through a channel which extends along at least part of an edge of the object, wherein liquid is retained in the channel by an indentation defined on, or a projection or element present at, a bottom of the channel.

According to an aspect, there is provided a method of operating an immersion lithographic apparatus, comprising: providing a liquid onto an object supported by a table; and removing liquid from an edge of the object through a channel which extends along at least part of an edge of the object, wherein liquid is retained in the channel by a projection or element at least partly blocking passage of liquid along the channel in a direction in which the channel is elongate.

According to an aspect, there is provided a method of operating an immersion lithographic apparatus, comprising: providing a liquid onto an object supported by a table; and removing liquid from an edge of the object through a channel which extends along at least part of an edge of the object, wherein liquid is retained in the channel by an indentation defined on, or a projection or element present at, a side wall of the channel.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
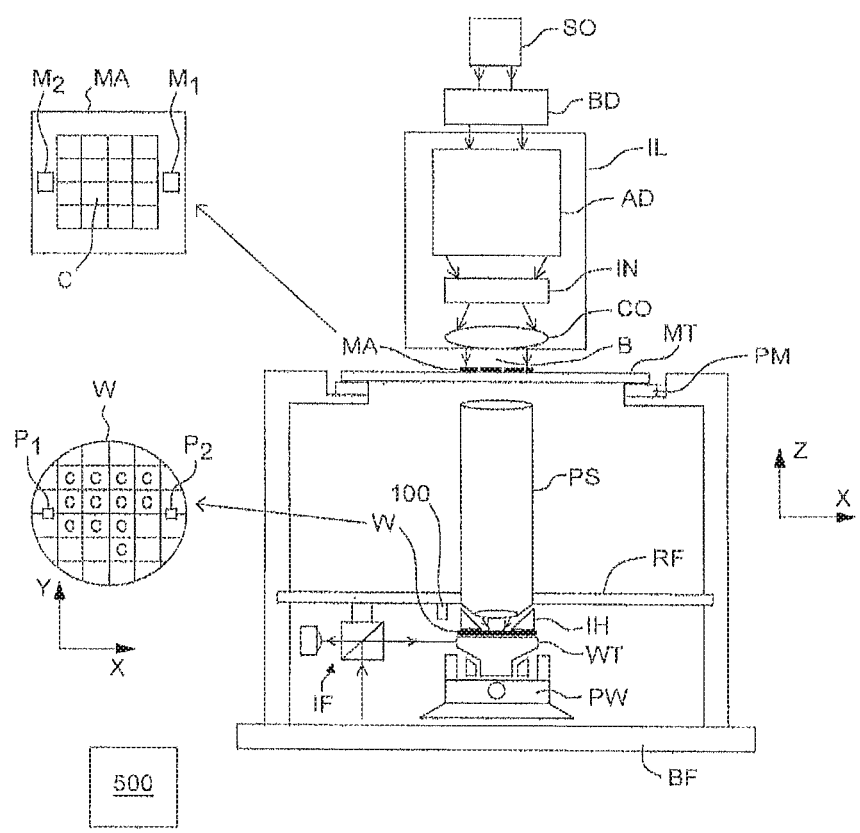
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

a support table, e.g. a sensor table to support one or more sensors or a substrate table WT constructed to hold a substrate (e.g. a resist-coated substrate) W, connected to a second positioner PW configured to accurately position the surface of the table, for example of a substrate W, in accordance with certain parameters. In the following, reference to a substrate table WT can also be read as a reference to an object table (for example a table to support one or more sensors) and vice versa; and a projection system (e.g. a refractive projection lens system) PS configured to project a pattern imparted to the radiation beam B by patterning device MA onto a target portion C (e.g. comprising part of, one, or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two or more tables (or stage(s) or support(s)), e.g., two or more substrate tables or a combination of one or more substrate tables and one or more sensor or measurement tables. In such "multiple stage" machines the multiple tables may be used in parallel, or preparatory steps may be carried out on one or more tables while one or more other tables are being used for exposure. The lithographic apparatus may have two or more patterning device tables (or stage(s) or support(s)) which may be used in parallel in a similar manner to substrate, sensor and measurement tables.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion (and size of the exposure field) determines the height (in the scanning direction) of the target portion C.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Arrangements for providing liquid between a final element of the projection system PS and the substrate can be classed into three general categories. These are the bath type arrangement, the so-called localized immersion system and the all-wet immersion system. In a bath type arrangement substantially the whole of the substrate W and optionally part of the substrate table WT is submersed in a bath of liquid.

A localized immersion system uses a liquid supply system in which liquid is only provided to a localized area of the substrate. The space filled by liquid is smaller in plan than the top surface of the substrate and the volume filled with liquid remains substantially stationary relative to the projection system PS while the substrate W moves underneath that volume. FIGS. 2-5 show different supply devices which can be used in such a system. A sealing feature is present to seal liquid to the localized area. One way which has been proposed to arrange for this is disclosed in PCT patent application publication no. WO 99/49504.

In an all wet arrangement the liquid is unconfined. The whole top surface of the substrate and all or part of the substrate table is covered in immersion liquid. The depth of the liquid covering at least the substrate is small. The liquid may be a film, such as a thin film, of liquid on the substrate. Immersion liquid may be supplied to or in the region of a projection system and a facing surface facing the projection system (such a facing surface may be the surface of a substrate and/or a substrate table). Any of the liquid supply devices of FIGS. 2-5 can also be used in such a system. However, a sealing feature is not present, not activated, not as efficient as normal or otherwise ineffective to seal liquid to only the localized area.

Figure 2:
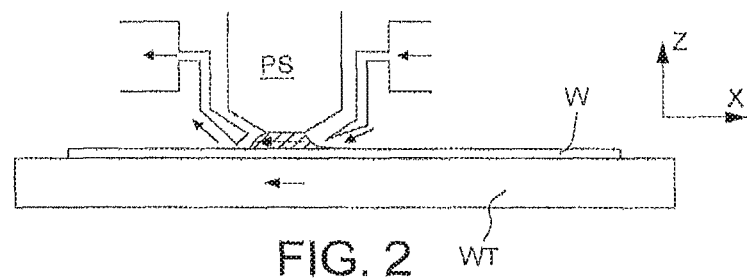
FIGS. 2 and 3 depict a liquid supply system for use in a lithographic projection apparatus.
Figure 3:
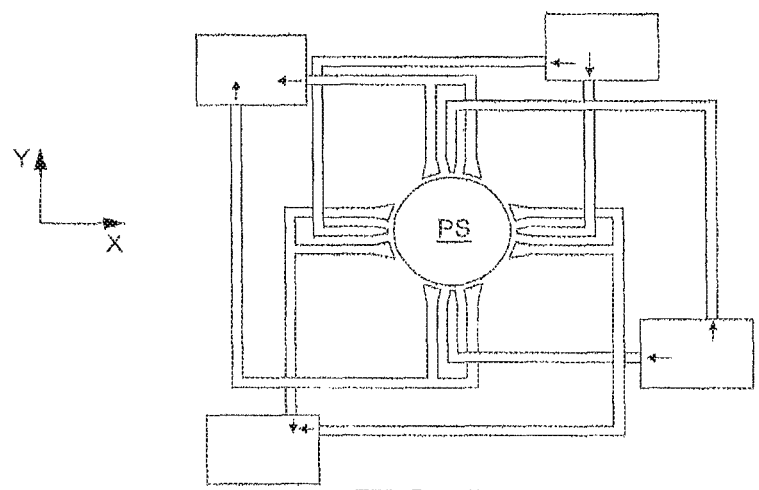

As illustrated in FIGS. 2 and 3, liquid is supplied by at least one inlet onto the substrate, preferably along the direction of movement of the substrate relative to the final element. Liquid is removed by at least one outlet after having passed under the projection system. As the substrate is scanned beneath the element in a −X direction, liquid is supplied at the +X side of the element and taken up at the −X side. Various orientations and numbers of in- and outlets positioned around the final element are possible; one example is illustrated in FIG. 3 in which four sets of an inlet with an outlet on either side are provided in a regular pattern around the final element. Note that the direction of flow of the liquid is shown by arrows in FIGS. 2 and 3.

Figure 4:
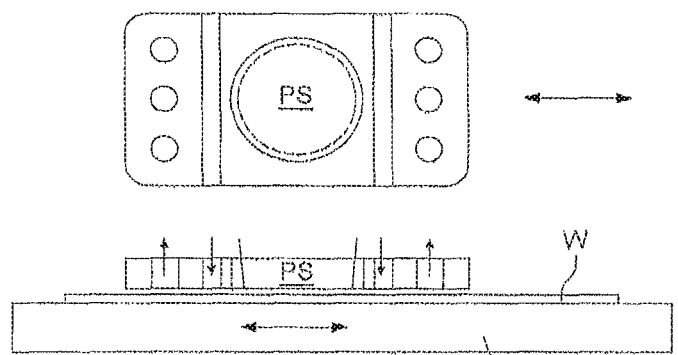
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. Note that the direction of flow of fluid and of the substrate is shown by arrows in FIG. 4.

Another arrangement which has been proposed is to provide the liquid supply system with a liquid confinement structure which extends along at least a part of a boundary of the space between the final element of the projection system and the substrate, substrate table or both. Such an arrangement is illustrated in FIG. 5.

Figure 5:
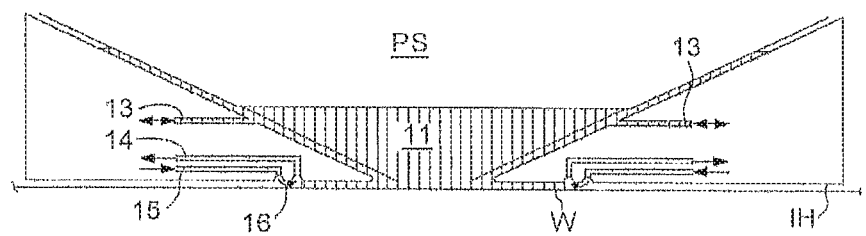
FIG. 5 depicts a further liquid supply system for use in a lithographic projection apparatus.

FIG. 5 schematically depicts a localized liquid supply system or fluid handling system with a liquid confinement structure IH, which extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) In an embodiment, a seal is formed between the liquid confinement structure IH and the surface of the substrate W and which may be a contactless seal such as a gas seal (such a system with a gas seal is disclosed in European patent application publication no. EP-A-1,420,298) or a liquid seal.

The liquid confinement structure IH at least partly contains liquid in the space 11 between a final element of the projection system PS and the substrate W. The space 11 is at least partly formed by the liquid confinement structure IH positioned below and surrounding the final element of the projection system PS. Liquid is brought into the space below the projection system PS and within the liquid confinement structure IH by liquid inlet 13. The liquid may be removed by liquid outlet 13.

The liquid may be contained in the space 11 by a gas seal 16 which, during use, is formed between the bottom of the barrier member IH and the surface of the substrate W. The gas in the gas seal is provided under pressure via inlet 15 to the gap between barrier member IH and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the barrier member IH and the substrate W contains the liquid in a space 11. Such a system is disclosed in United States patent application publication no. US 2004-0207824, which is hereby incorporated by reference in its entirety. In an embodiment, the liquid confinement structure IH does not have a gas seal.

An embodiment of the present invention may be applied to any fluid handling structure including those disclosed, for example, in United States patent application publication nos. US 2006-0158627, US 2006-0038968, US 2008-0212046, US 2009-0279060, US 2009-0279062, US 2004-0207824, US 2010-0313974 and US 2012-0120376, the contents of all of which are hereby incorporated in their entirety by reference.

A controller 500 controls the overall operations of the lithographic apparatus and in particular performs an operation process described further below. Controller 500 can be embodied as a suitably-programmed general purpose computer comprising a central processing unit, volatile and non-volatile storage means, one or more input and output devices such as a keyboard and screen, one or more network connections and one or more interfaces to the various parts of the lithographic apparatus. It will be appreciated that a one-to-one relationship between controlling computer and lithographic apparatus is not necessary. In an embodiment of the invention one computer can control multiple lithographic apparatuses. In an embodiment of the invention, multiple networked computers can be used to control one lithographic apparatus. The controller 500 may also be configured to control one or more associated process devices and substrate handling devices in a lithocell or cluster of which the lithographic apparatus forms a part. The controller 500 can also be configured to be subordinate to a supervisory control system of a lithocell or cluster and/or an overall control system of a fab. In an embodiment the controller operates the apparatus to perform an embodiment of the present invention. In an embodiment the controller 500 has a memory to store the results of a step one described herein for later use in a step two.

In a localized area liquid supply system, the substrate W is moved under the projection system PL and the liquid supply system. When, for example, an edge of the substrate W is to be imaged or when a sensor on the substrate table (or on a measurement table) is to be imaged or the substrate table is to be moved such that a dummy substrate or so-called closing plate can be positioned under the liquid supply system to enable, for example, substrate swap to take place, an edge of the substrate W (or other object) will pass under the space 11. Liquid may leak into the gap between the substrate W and substrate table WT. This liquid may be forced in under hydrostatic or hydrodynamic pressure or the force of a gas knife or other gas flow creating device.

Although one or more embodiments of the invention will be described below in relation to providing a drain around the edge of a substrate W, the one or more embodiments are equally applicable to one or more other objects placed or supported on a table including, but not limited to, a closing plate used to maintain liquid in the liquid supply system by being attached to the bottom of the liquid supply system during, for example, substrate swap and/or one or more sensors on a substrate table or a measurement table. Thus, any reference below to the substrate W should be considered to be synonymous with any other object, such as a sensor or closing plate. Any reference below to the substrate table WT should be considered to be synonymous with any other table, such as a measurement table.

Figure 6:
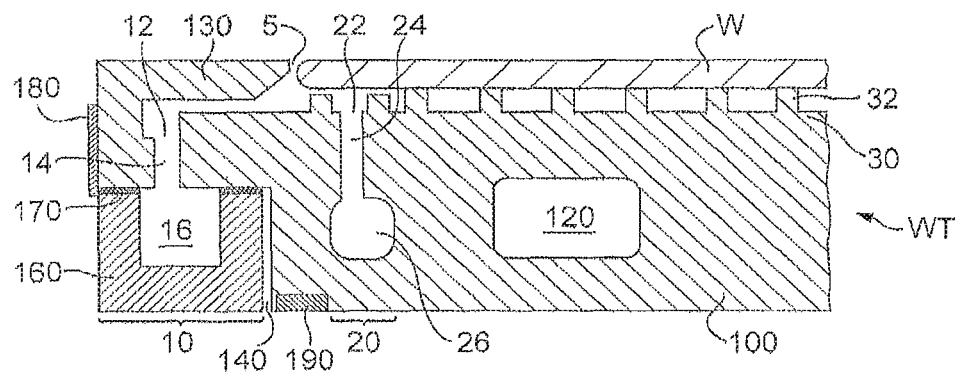
FIGS. 6-14 depict, in cross-section, a part of a substrate table of an embodiment.

FIG. 6 illustrates an embodiment of the present invention. FIG. 6 is a cross-section through a substrate table WT and a substrate W. A gap 5 exists between an edge of the substrate W and an edge of the substrate table WT. When the edge of the substrate W is being imaged or at other times such as when the substrate W first moves under the projection system PS (as described above), the space 11 filled with liquid by the liquid supply system IH (for example) will pass at least partly over the gap 5 between the edge of the substrate W and the edge of the substrate table WT. This can result in liquid from the space 11 entering the gap 5.

The substrate W is held by a substrate holder 30 (e.g. a pimple or burl table) comprising one or more projections 32 (burls). An underpressure applied between the substrate W and the substrate table WT by the substrate holder 30 helps ensure that the substrate W is held firmly in place. However, if liquid gets between the substrate W and the substrate holder 30 this can lead to difficulties, particularly when unloading the substrate W.

In order to deal with the liquid entering that gap 5 at least one drain 10, 20 is provided at the edge of the substrate W to remove liquid which enters the gap 5. In the embodiment of FIG. 6 two drains 10, 20 are illustrated though there may only be one drain or there could be more than two drains. In an embodiment, each of the drains 10, 20 is annular so that the whole periphery of the substrate W is surrounded.

A primary function of the first drain 10 (which is radially outward of the edge of the substrate W/substrate holder 30) is to help prevent bubbles of gas from entering the liquid 11 of the liquid supply system IH. Such bubbles may delete-riously affect the imaging of the substrate W. The first drain 10 is present to help avoid gas in the gap 5 escaping into the liquid reservoir 11 in the fluid handling structure IH. If gas does escape into the liquid reservoir 11, this can lead to a bubble which floats within the reservoir 11. Such a bubble, if in the path of the projection beam, may lead to an imaging error. The first drain 10 is configured to remove gas from the gap 5 between the edge of the substrate W and the edge of the recess in the substrate table WT in which the substrate W is placed. The edge of the recess in the substrate table WT may be defined by a cover ring 130 which is optionally separate from a support body 100 of the substrate table WT. The cover ring 130 may be shaped, in plan, as a ring and surrounds the outer edge of the substrate W. The first drain 10 extracts mostly gas (say between 20 and 100 normal liters per minute (Nl/min)) and only a small amount of immersion liquid (say about 10-20 ml/min). With such a two phase flow, the immersion liquid evaporates thus cooling down the substrate table WT surrounding the edge of the substrate W. This can result in deformation of the substrate W, eventually leading to decreased overlay performance.

The second drain 20 (which is radially inward of the edge of the substrate W/substrate holder 30) is provided to help prevent liquid which finds its way from the gap 5 to underneath the substrate W from preventing efficient release of the substrate W from the substrate table WT after imaging. The provision of the second drain 20 reduces or eliminates any problems which may occur due to liquid finding its way underneath the substrate W.

Both the first and second drains 10, 20 remove liquid by way of an underpressure. That is, both drains are connected via one or more outlets (not illustrated) to an underpressure source. The underpressure source effectively removes liquid which enters the respective drain 10, 20. However, the underpressure source is also effective to draw gas in from outside of the gap 5 above the substrate table WT (or in the case of the second drain 20, also from the substrate holder 30) through the respective drains 10, 20 and out through the outlets. This flow of liquid and gas is not constant or uniform around the periphery of the drains 10, 20 during use of the immersion apparatus. One or more measures may be taken to only connect the outlets to the underpressure source when there is a chance of liquid entering the gap 5, but there is still the risk of an uneven heat load being applied to the substrate table WT because of the varying amount of gas and/or liquid which passes through the drains 10, 20. These temporal and/or positional uneven flows of gas and liquid result in different rates of evaporation of liquid in the drains 10, 20 thereby leading to variation in the heat losses generated by the drains 10, 20 during exposure of a batch of substrates. This is because the substrate table WT is only positioned such that an edge of the substrate W is under the space 11 during certain times which is exposure routing dependent. Thus for the first substrate of a batch of substrates, the evaporation load is at different locations of the periphery of the substrate than for the following substrates (because for the first substrate there has not been a preceding substrate moving under the projection system PS during which an uneven evaporation load is set up). Furthermore, the timing delay of a substrate delivery from the track at the start of a new batch results in an evaporation load change due to drying up of the drains 10, 20 (and thereby less evaporation). Even if the thermal load is substantially constant, it can be difficult to help ensure a uniform temperature of the substrate table WT as a result.

The construction details of each of the drains will be described in detail below. However, it should be understood that the principles herein can be applied to any type of drain in an immersion apparatus which by virtue of use of the apparatus is provided with a varying flow of liquid and/or gas through it and can thereby result in a thermal load, particularly where it results in varying amounts of evaporation and thereby varying thermal load.

The substrate table WT comprises a support body 100. In an embodiment at least one channel 120 is provided for the passage therethrough of a thermal conditioning liquid to help maintain the temperature of the support body 100 at a certain (e.g., predetermined) temperature and/or uniformity. The first and second drains 10, 20 are each provided with an opening 12, 22 and a channel 16, 26. The channel 16, 26 is in fluid communication with the respective opening 12, 22 through a passageway 14, 24. The opening 12, 22 may be provided at one or more discrete locations around the periphery of the edge of the substrate W and may, in plan, be slits or circular openings or any other shape. In an embodiment three discrete circular openings are provided around the edge of the substrate W, for instance. An opening 12, 22 may only be a small opening, for example of 2 mm diameter, in the periphery of a substrate W.

The thermal load may be counteracted by, for example, using a hydrophobic coating and/or a heater positioned around the first drain 10. However, such measures may not sufficiently eliminate overlay error (the error in position of a subsequently formed pattern relative to an earlier formed pattern) or minimize it within an acceptable tolerance.

An embodiment of the invention is illustrated as being applied to the first drain 10 in the below described embodiments. However, an embodiment of the invention can equally be applied to the second drain 20 or to both the first and the second drains 10, 20.

More than 90% of the evaporation of liquid in the first drain 10 may take place in the channel 16 rather than in the passageway 14. The large thermal load in the channel 16 leads to shrinking of the material taking place, which imparts a deformation to the support body 100 and can result in deformation of the substrate W. Additionally, the cooling thermal load applied in the channel 16 may result in a cooling down of the center part of the support body 100 also leading to deformation of the substrate W. In an embodiment of the present invention the above mentioned problems are reduced or eliminated by defining the channel with a first material which is different to a second material defining the passageway 14. In an embodiment, different materials are used to define the channel 16 of the first drain 10 such that, in use, a lower thermal load and/or a lower thermal deformation load is applied to the support body 100 than if the same material were used to define the channel 16 as is used to define the passageway 14.

Thus, in an embodiment, a conventional substrate table may be used except that the channel of a drain is made of a different material to the remainder of the substrate table.

In an embodiment, referring to FIG. 6, the member 160 defining side walls and a bottom of the channel 16 is made of a first material which is different to a second material defining the passageway 14. In the embodiment of FIG. 6 the passageway is defined by the second material which is the same as the material of the support body 100 of the substrate table WT.

In an embodiment the material of the support body 100 (and that defining the passageway 14) is siliconized silicon carbide (SiSiC), silicon carbide, quartz or aluminum nitride. Such materials typically have a coefficient of thermal expansion of $1$-$6 \times 10^{-6}$/K and a coefficient of thermal conductivity of about 50-500 W/mK.

In an embodiment the material of the element 160 is a structural element, for example a self-supporting structural element which does not require a support to avoid bending under self weight. That is, in an embodiment, the first material is not a coating. In an embodiment the first material is not supported by a structural element of the substrate table WT and it is made of a material and design such that it can support itself substantially without deflection.

In an embodiment the first material of element 160 has a different coefficient of thermal expansion to the second material. For example, the coefficient of thermal expansion of the first material is at least an order of magnitude less than that of the second material. In an embodiment the first material has a coefficient of thermal expansion of less than or equal to $1 \times 10^{-6}$/K. In an embodiment the coefficient of thermal expansion of the first material is less than or equal to $0.5 \times 10^{-6}$/K or less than or equal to $0.25 \times 10^{-6}$/K. In an embodiment the coefficient of thermal expansion of the first material is in the range $10$-$100 \times 10^{-9}$/K. The low thermal coefficient of thermal expansion of the first material means that a thermal load applied to the channel 16 does not result in much expansion/contraction of the element 160. Thus, a thermal deformation cannot be substantially transmitted to the support body 100. In an embodiment the element 160 is made of the first material which is a glass-ceramic. A specific type of glass-ceramic is an aluminosilicate glass-ceramic such as Zerodur® available from Schott Glass Technologies. Such a material has a coefficient of thermal expansion at 25° C. of $30 \times 10^{-9}$/K and a thermal conductivity of 1.5 W/mK. In an embodiment the element 160 is made of cordierite which has a coefficient of thermal expansion of thermal expansion at 25° C. of about $1.7 \times 10^{-6}$/K and a coefficient of thermal conductivity of about 3.0 W/mK.

In an alternative or additional embodiment, the element 160 is made of a material with a very low stiffness (for example with a Young's Modulus of less than or equal to $100 \times 10^9$ Pa, less than or equal to $50 \times 10^9$ Pa or less than or equal to $10 \times 10^9$ Pa). In an embodiment the material of the element 160 has a low thermal conductivity to reduce or minimize heat transfer to the support body 100. For example, the thermal conductivity could be in the ranges described below with reference to FIG. 14.

In the embodiment of FIG. 6 a heater 180 is provided adjacent the passageway 14 and coupled (e.g. attached) to the second material. The heater 180 is used to apply a heat load to the substrate table WT to compensate for evaporational heat load in the first drain 10. A temperature sensor 190 is provided to aid in control of the heater 180 which may be under the control of the controller 500. The position of the heater 180 advantageously provides a means to compensate for any thermal load, further reducing the temperature difference between the element 160 and support body 100. The heater 180 may be driven in a feedback manner on the basis of the signal from the temperature sensor 190, for example. The heater 180 is radially outward of the passageway 14. The heater 180 is radially outward of the channel 16. The heater 180 is above the channel 16. The temperature sensor 190 is radially inward of the channel 16. The temperature sensor 190 is below the channel 16. In an embodiment two heaters 180 may be present. In an embodiment the heater(s) 180 may be in the form of a thin film heater. Such heaters might result in better thermal compensation of the thermal load and advantageously take up little volume. In an embodiment a heater is disposed in the gap 140 attached to the first material and/or a heater is disposed in the gap 140 attached to the second material.

Figure 11:
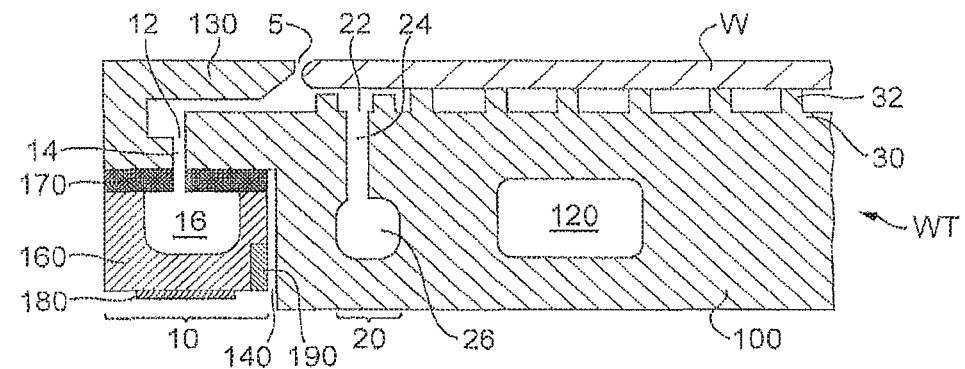
Figure 12:
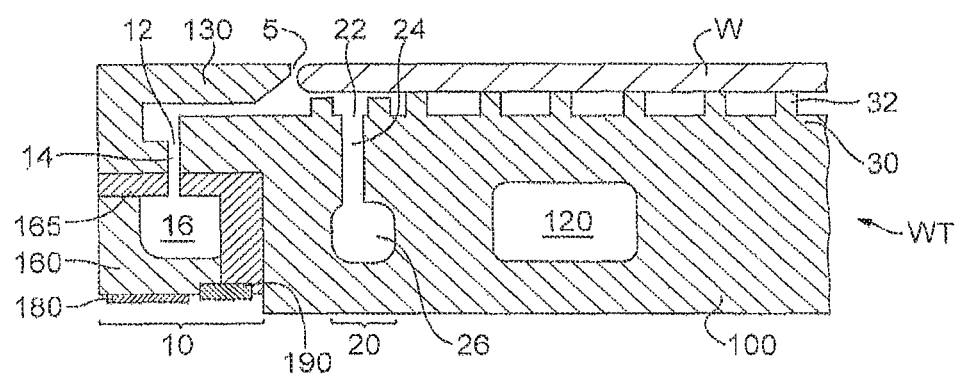
Figure 13:
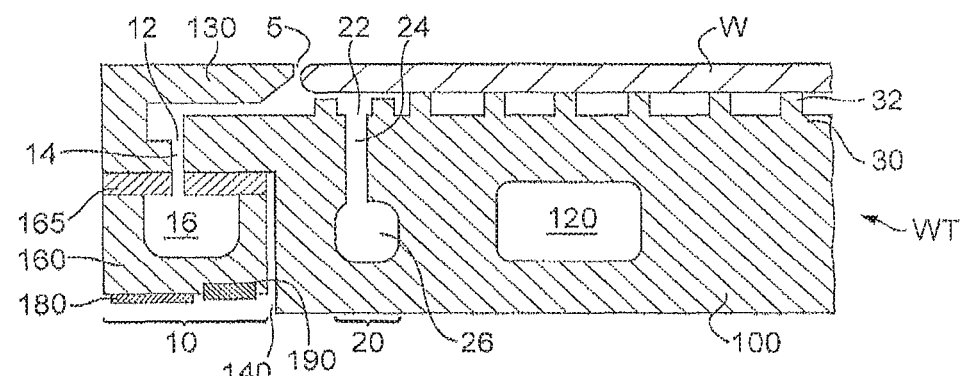

In an embodiment the element 160 is mechanically decoupled from the support body 100. This can be achieved by providing a layer of glue 170 between the first and second materials to adhere the element 160 to the second material. The layer of glue 170 is above the channel 16. An advantage of a layer of glue 170 is that it is likely to have a low thermal conductivity and therefore act as a thermal barrier. Additionally glue has a low Young's Modulus so that thermal expansion or contraction of the support body 100 is substantially not transmitted to the element 160. In the case of FIGS. 11-13 use of a glue layer 170 is advantageous in that thermal deformation of the element 160 is substantially not transmitted to the support body 100. In an embodiment the layer of glue has a Young's Modulus of less than or equal to $10\times10^9$ Pa and/or a coefficient of thermal expansion of less than or equal to 10 W/mK, less than or equal to 5 W/mK or less than or equal to 2 W/mK. In an embodiment the layer of glue 170 is araldite which has a Young's Modulus of $2\times10^9$ Pa and a coefficient of thermal expansion of 0.22 W/mK.

In an embodiment, the element 160 is bonded to the support body 100 without glue, for example by anodic bonding.

In an embodiment a gap 140 is provided between the element 160 made of the first material and the support body 100. The gap 140 is radially inward of the channel 16. The gap may be filled with an insulating material or left open such that it is filled with gas or a vacuum. The gap 140 serves to mechanically and/or thermally insulate the element 160 made of the first material from the support body 100. In an embodiment the gap 140 is at least 0.2 mm wide. In an embodiment the gap 140 is at least 0.5 mm wide.

Figure 7:
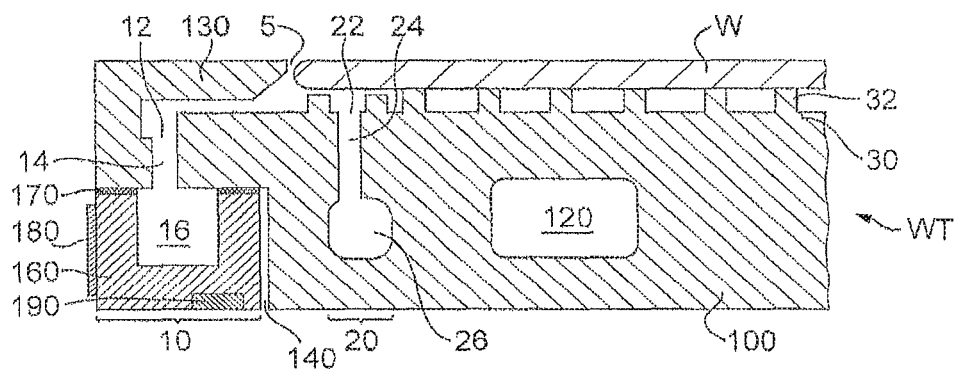

The embodiment of FIG. 7 is the same as that of FIG. 6 except that the position of the heater 180 and temperature sensor 190 have been changed to be positioned on (e.g. coupled to) the element 160 made of the first material. In the embodiment of FIG. 7 the heater 180 is at the same level as the channel 16. The temperature sensor 190 is below the channel 16 and radially inward of the channel 16. In the FIG. 7 embodiment lowering the position of the heater 180 compared to the FIG. 6 embodiment may lower the thermal disturbance of the support body 100 as a result of the element 160 cooling down.

Figure 8:
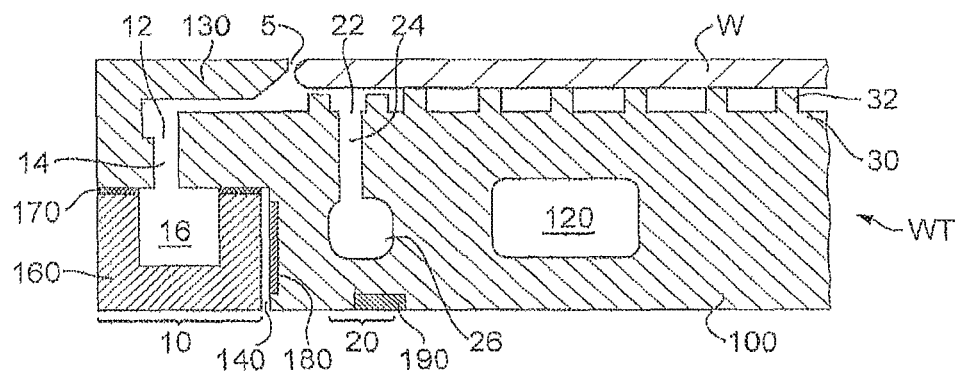

FIG. 8 is the same as FIG. 6 except as described below. In the FIG. 8 embodiment the heater 180 is located on the support body 100 radially inward of the channel 16. Thus, this allows the compensating thermal load to be applied by the heater 180 at the location where deleterious thermal load resulting from evaporation in the channel 16 will act on the support body 100. The sensor 190 is positioned within the support body 100. This is advantageous as it is thermal uniformity/consistency of the support body 100 which is desirable. In an embodiment the sensor 190 is positioned under the channel 26 of the second drain 20. The embodiment of FIG. 8 may be even more effective at reducing thermal load on the support body 100 and also helps ensure that the thermal control system, comprising the heater 180 and sensor 190, controls the temperature of the support body 100 more directly.

Figure 9:
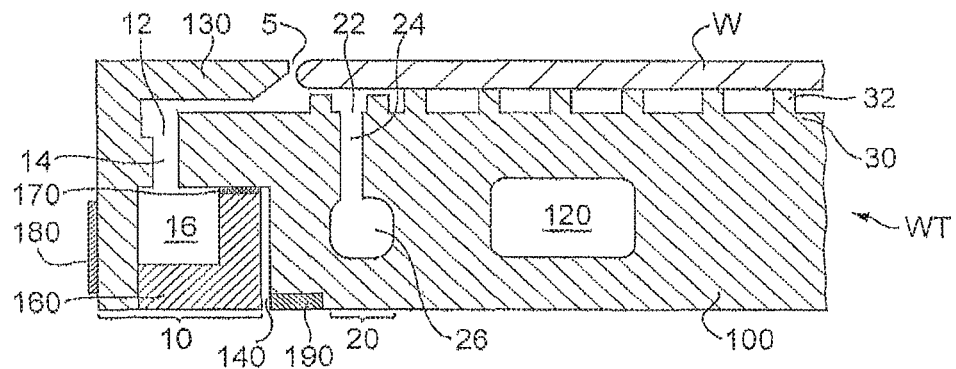

The embodiment of FIG. 9 is the same as the embodiment of FIG. 6 except as described below. In the embodiment of FIG. 9 the element 160, instead of having a U-shape in cross-section, is an L-shape. Therefore, the element 160 and first material define the inner wall and lower wall of the channel 16. The second material extends down from radially outward of the passageway 14 to define a radially outer wall of the channel 16. This may be advantageous due to easier manufacturability than the embodiment of FIG. 6. In an embodiment the heater 180 is positioned radially outward of the channel 16 at the same level as the channel 16. The heater 180 is positioned on the second material which defines the radially outer part of the channel 16.

Figure 10:
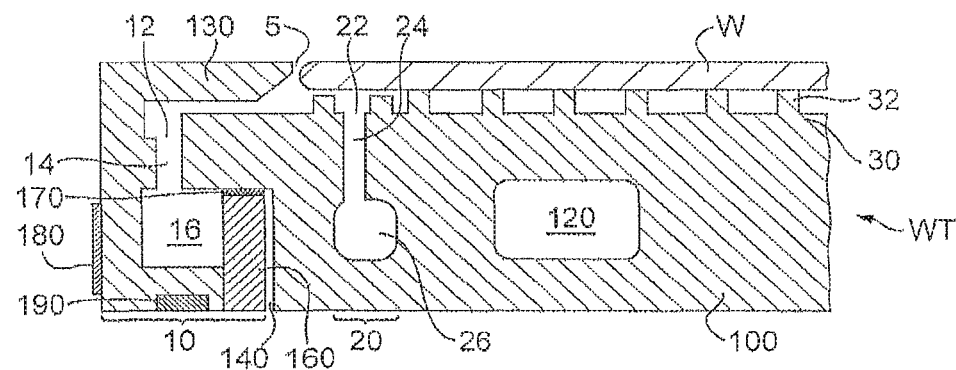

The embodiment of FIG. 10 is the same as that of FIG. 9 except as described below. In the embodiment of FIG. 10 the bottom of the channel 16 is also defined by the second material. Thus, the first material in the element 160 only defines the radially inner wall of the channel 16. In this embodiment the temperature sensor 190 is positioned underneath the channel 16 and is coupled to the second material. The embodiment of FIG. 10 may be the easiest to manufacture while still dramatically reducing the mechanical and thermal disturbance of the support body 100 by the thermal load within the channel 16.

In the embodiment of FIGS. 6-10, the channel 16 is permitted to receive a large evaporational cooling load as the channel 16 will not substantially thermally deform. As a result, mechanical deformation will not be substantially transmitted to the support body 100. Additionally, if the first material 160 has a relatively low thermal conductivity (for example less than or equal to 10 W/mK or less than or equal to 5 W/mK or even less than or equal to 2 W/mK (as does Zerodur (which is 1.5 W/mK)) this results in minimal thermal disturbance of the support body 100 which can be compensated with the heater 180. Additionally the gap 140 and glue layer 170 reduce heat transfer to the support body 100.

All of the embodiments of FIGS. 6-10 are advantageous in that they do not use up any more space on a substrate table WT than current designs. Additionally, as only a small part of the substrate table is changed, old substrate tables could be refurbished incorporating an embodiment of the present invention.

The embodiment of FIG. 11 is the same as that of FIG. 6 except as described below. In FIG. 11 the element 160 defining the channel 16 is made of a material which has a different thermal conductivity to the second material. The element 160 made of the first material has a higher thermal conductivity than that of the second material. In this way the uniformity of temperature of the element 160 around the entire periphery of the substrate W can be maintained. Therefore, a local thermal load, which can lead to non-uniformity of temperature of the element 160 of several Kelvin, is evenly distributed. Therefore, in the embodiment of FIG. 11 a decrease in temperature of the element 160 compared to the support body 100 is accepted (and counteracted by use of the gap 140, glue layer 170 and heater/temperature sensor 180/190).

In an embodiment the thermal conductivity of the first material is at least 500 W/mK. In an embodiment the thermal conductivity of the first material is at least 800 W/mK or at least 1000 W/mK. In an embodiment the first material of which the element 160 is made has a thermal conductivity at least an order of magnitude larger than that of the second material. The second material typically has a thermal conductivity of about 100 W/mK whereas the first material of the element 160 can have a thermal conductivity of greater than 1000 W/mK. One example material is pyrolytic graphite which has a thermal conductivity of greater than 1000 W/mK or industrial diamond which has a thermal conductivity of about 2000 W/mK.

An additional advantage of a highly conductive first material is that the heater 180 may be moved to the bottom of the element 160 and coupled to the first material. This is advantageous because there is more space at the bottom of the channel 16 compared to at the side. Also the temperature sensor 190 can be positioned radially inward of the channel 16 where the temperature is most important.

The embodiment of FIG. 12 is the same as that of FIG. 11 except as described below. In the FIG. 12 embodiment instead of completely relying on the glue layer 170 and gap 140 for thermal insulation, a further element 165 may be positioned above and/or radially inwardly of the element 160 of the first material. The further element 165 can be seen as a thermal barrier between the first material (of the element 160) and the second material (of the support body 100). In an embodiment the further element 165 is glued to the element 160 and/or support body 100. In an embodiment the further element 165 is anodically bonded to the support body 100.

In an embodiment the material of the further element 165 is chosen such that interaction with liquid is unlikely. Thereby a potential difficulty of interaction of liquid with the glue layer 170 is reduced. For example the material of the second element 165 may have a low thermal conductivity and/or low coefficient of thermal expansion. One such material is an aluminosilicate glass-ceramic such as Zerodur. Another possible material may be cordierite which is a magnesium iron aluminum cyclosilicate.

The thickness of the further element 165 may need to be greater than that of the corresponding glue layer 170 and gap 140 of FIG. 11 as the thermal conductivity of the material is likely to be greater than that of glue or gas. This potential difficulty is partly alleviated in the embodiment of FIG. 13 which is the same as that of FIG. 12 except as described below. In the embodiment of FIG. 13 it is only the glue layer 170 of FIG. 11 which is replaced by the further element 165. The gap 140 of FIG. 11 is maintained. As a result, the embodiment of FIG. 13 may take up less volume in the substrate table WT than that of FIG. 12.

The material of the further element 165 can be seen as the first material in that it is different to the material of the support body 100 which defines the passageway 14. The embodiments of FIGS. 12 and 13 with the further element 165 can be regarded as similar to the embodiments of FIGS. 6-10 in that the further element 165 is a material with a low thermal conductivity and the further element 165 defines at least part of the channel 16. In the embodiment of FIG. 12 the further element 165 defines the top and radially inner walls of the channel 16. In the embodiment of FIG. 13 the further element 165 defines only the top surface of the channel 16.

In the embodiments as illustrated in FIGS. 6-13, the element 160 is described as a self-supporting structural element. However, this need not necessarily be the case and the element 160 may instead be an element of a material other than the first material which is coated with the first material. In an embodiment the first material is supported by the structural element 160. In that embodiment the structural element 160 may be a material which is the same or similar to that of the support body 100. The embodiment of FIG. 14 uses this idea. Although the first material is not a coating it is not self-supporting (i.e. it deforms significantly under its own weight) and is supported by a structural element. The structural element may be made of the same material as the support body 100.

Figure 14:
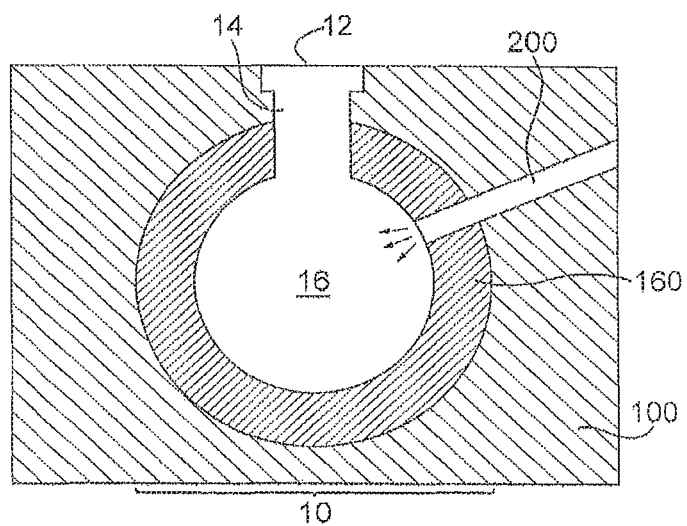
Figure 15:
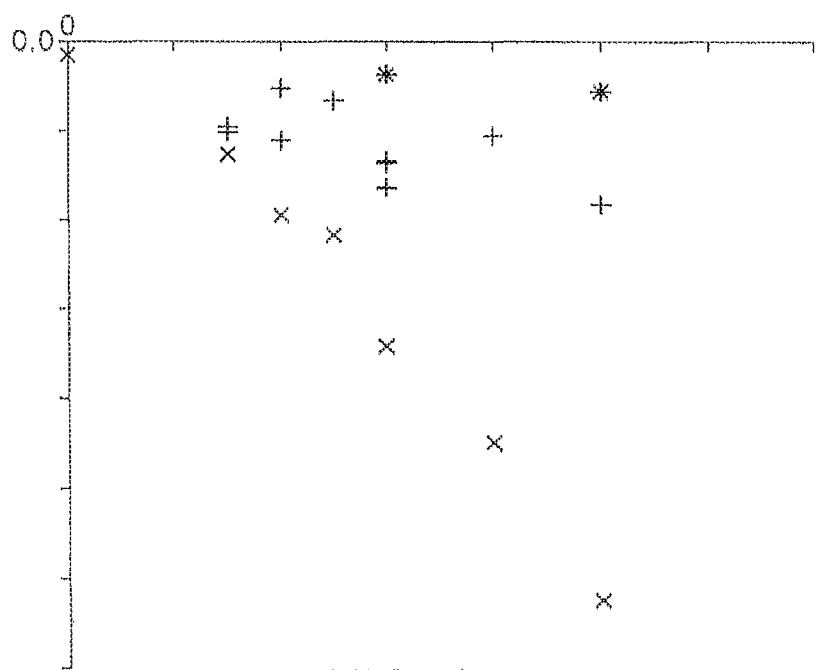
FIG. 15 is a graph illustrating the benefit of an embodiment of the invention.

The embodiment of FIG. 14 is the same as that of FIG. 6 except as described below. In FIG. 14 only details of the first drain 10 are illustrated. However, as with all other embodiments, the second drain 20 may be present and may or may not be designed in the same way as the first drain 10 as in this or any other embodiment. In an embodiment the element 160 is a thermal insulator and made of a different material to that of the support body 100. In an embodiment the thermal conductivity of the first material of the element 160 is at least an order of magnitude lower than that of the second material. In an embodiment the thermal conductivity of the first material is at least two orders of magnitude lower than that of the second material. In an embodiment the thermal conductivity of the first material of the element 160 is less than or equal to 10 W/mK or less than or equal to 5 W/mK. In an embodiment the thermal conductivity of the first material is less than or equal to 2 W/mK. In an embodiment the thermal conductivity of the first material is less than or equal to 1 W/mK. The first material may be a glass or a polymer. In an embodiment the first material is polytetrafluoroethylene (PTFE). In an embodiment the first material is high-density polyethylene (HDPE). In an embodiment the first material is polypropylene (PP). In an embodiment the first material is polyvinyl chloride (PVC). In an embodiment the first material is rubber. In an embodiment the first material is cork. Glass has a thermal conductivity of 1.05 W/mK at 25° C. PTFE has a thermal conductivity of 0.25 W/mK at 25'C. HDPE has a thermal conductivity of 0.45 W/mK at 25° C. PP has a thermal conductivity of 0.15 W/mK at 25° C. PVC has a thermal conductivity of 0.19 W/mK at 25° C. Rubber has a thermal conductivity of 0.13 W/mK at 25° C. Cork has a thermal conductivity of 0.07 W/mK at 25° C. This compares with the thermal conductivity of the types of material of which the support body 100 may be made of 100 W/mK. Thus, the channel 16 is locally isolated with a low thermal conductivity material from the support body 100. As the results in FIG. 15 show, a total improvement of about 50% in thermal load for a 0.5 mm thick FIFE element 160 is achievable.

In the embodiment of FIG. 14 the element 160 takes the form of an insert, e.g. a pipe, which is not self-supporting and which is supported by the second material (for example is supported on a surface of a channel formed in the support body 100). In an embodiment the element 160 may be in the form of a coating, for example a glass coating. In an embodiment the element 160 may be in the form of a pipe which is inserted into a channel formed in the support body 100. In an embodiment the first element 160 may take the form of any of FIGS. 6-13, as described above.

If the element 160 has a low thermal conductivity, the temperature of the liquid in the channel 16 is lower because heat is not substantially conducted towards the cold liquid quickly. This advantageously results in a lower vapor pressure (and thereby less evaporation). Additionally higher heat removal results through removal of a given quantity of the liquid (because the liquid has a lower temperature). The insulating element 160 acts as a low-pass filter because of larger time constants in heat variations. Additionally, particularly if the first element is made of PTFE, liquid has a high contact angle with this (e.g., it is hydrophobic) and this results in lower residence time of liquid in the channel 16. A heater 180 and/or sensor 190 may be used in conjunction with the embodiment of FIG. 14. However, a lower power rated heater 180 may be sufficient because of the lower thermal load applied to the support body 100.

A further refinement is illustrated in FIG. 14. The further refinement may be applied to any other embodiment. The further refinement may be applied to only the first drain 10, only the second drain 20 or to both the first and second drains 10, 20. The refinement is the same as that described in United States patent application publication no. US 2008/0297744, the contents of which are hereby incorporated in their entirety. A liquid supply device configured actively to supply a second liquid to the drain 10, 20 independent of the position of the substrate table WT is provided. The supply of a second liquid (through channel 200) can result in a decrease in the amount of evaporation in the drain 10, 20. The way this is accomplished can be viewed in two separate ways. First, it can be seen as helping ensure that gas which would otherwise cause evaporation is saturated or at least nearly saturated with the same (type of) liquid as is used by the liquid supply device IH so that this gas passing over liquid in the drain cannot significantly cause evaporation. Second, it can be seen as providing a continuous flow of (immersion) liquid through the drain 10, 20 thereby evening out the thermal load over time.

It should be understood that the principles herein can be applied to any type of drain in an immersion apparatus which by virtue of use of the apparatus is provided with a varying flow of liquid and/or gas through it and can thereby result in varying amounts of evaporation and thereby varying thermal load. It will also be appreciated that the means to provide liquid to the drain or the means to saturate gas in the drain can be provided at any location so long as the function as described above is met and as long as there are no deleterious interactions with other components of the apparatus.

A liquid channel 200 is provided with an inlet into the channel 16. This liquid channel 200 can provide a spray of liquid, as illustrated, or can provide a continuous flow of liquid or anything in between (e.g. a constant drip of droplets). In that way, either gas in the respective channel can be saturated (or nearly saturated) or a continuous flow of liquid through each channel is provided.

Only one of the channels 16, 26 could be provided with a liquid channel 200 or alternatively or additionally a liquid inlet could be provided in the passageway 14, 24 or even in the gap 5. If a liquid channel is provided in the gap 5, one liquid inlet may be sufficient for both the first and second drains 10, 20. In this description when a single liquid channel is referred to this means a single liquid channel in cross-section. Of course the liquid channel 200 can be provided as continuous (annular) groove or could be provided as discrete inlets around the periphery of the drain.

FIG. 15 shows experimental or simulated results showing flux variation to the support body 100 on the y axis versus flow rate along the x axis. Three drains were compared. One drain with an uninsulated channel 16 defined by siliconized silicon carbide (diagonal crosses), another with the same channel 16 except for the insertion of a 0.9 mm thick PTFE tube as illustrated in FIG. 14 (horizontal/vertical crosses) and another with the PTFE tube and water being applied through channel 200 at a rate of about 10 ml/min per $\frac{1}{10}^{th}$ of the circumference of the drain 10 (stars). As can be seen from FIG. 15, the uninsulated channel applies the largest flux to the support body 100, followed by the insulated channel. The best performer is the combination of insulated channel with water supplied through channel 200.

In any of the embodiments a coating may be applied to the first material. In such an embodiment the first material does not define the actual surface of the channel 16. The coating may be, for example, a hydrophobic coating to help in reducing evaporational thermal loads. Additionally a coating may be present on the surface of the passageway 14 such that the second material does not define the actual surface of the passageway 14, but only its general shape.

The features of any embodiment may be combined with those of another. For example the embodiment of FIG. 14 could be combined with any embodiment of FIGS. 6-13. Additionally the embodiments of FIGS. 6-10 and 11-13 could be combined (e.g. high thermal conductivity and low thermal expansion) with or without an insert in the channel such as illustrated in FIG. 14. Any embodiment may be combined with the liquid channel 200/liquid supply device of FIG. 14.

FIGS. 16-26 illustrate, in cross-section, further embodiments. In those Figures only details of the first drain 10 are illustrated. However, as with all other embodiments, the second drain 20 may be present and the first drain and/or second drain may be designed in the way described for the first drain 10. The other drain may be as described in any other embodiment or may be other than as described herein or may not even be present.

The embodiments of FIGS. 16-26 are described without reference to the channel 16 being defined by a first material which is different to the second material defining the passageway 14. This may or may not be the case and the embodiments of FIGS. 16-26 may or may not incorporate features of one or more of the foregoing embodiments.

The embodiments of FIGS. 16-26 are arranged to help ensure that liquid (e.g. water) remains in the channel 16. Due to a continuous presence of liquid inside the channel 16, the evaporation rate and therefore the cold load on the object table WT varies less than otherwise.

Figure 16:
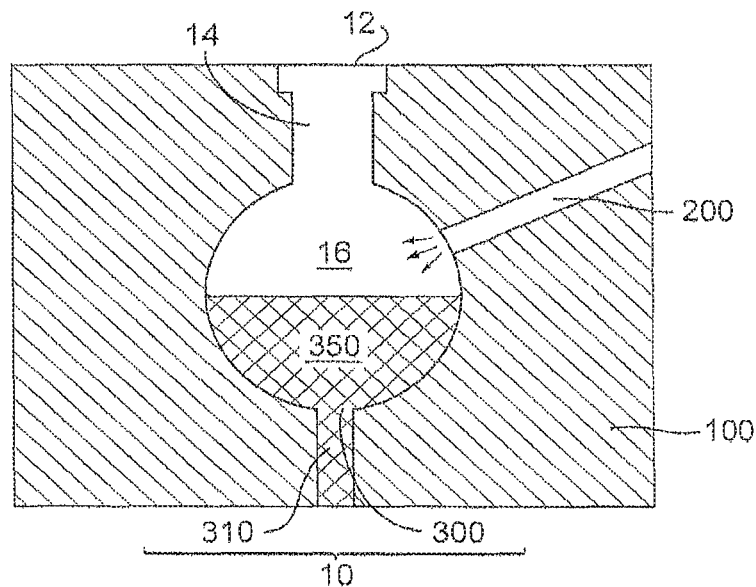
FIGS. 16-26 depict, in cross-section, a part of a substrate table of an embodiment.

In the embodiment of FIG. 16, the object table WT is provided with a liquid channel 200 as in the embodiment of FIG. 14. An opening 300 in the channel 16 is depicted. The opening 300 may be one or more discrete openings along the elongate length of the channel 16 (in and out of the page) or may be a semi-continuous or discontinuous slot. A passage 310 leads from the opening 300 to an under pressure source.

In an embodiment the under pressure source connected to the passage 310 is under the control of controller 500. The controller 500 is operated such that extraction of liquid from the channel 16 is controlled to retain liquid 350 in the channel 16. Therefore, this is an active solution. In an embodiment the controller 500 additionally or alternatively controls the rate of flow of liquid through the liquid channel 200, for the same purpose.

In an embodiment the liquid channel 200 is not present and the liquid 350 which is continuously present in the channel 16 is provided exclusively through the opening 12 and passageway 14.

Figure 17:
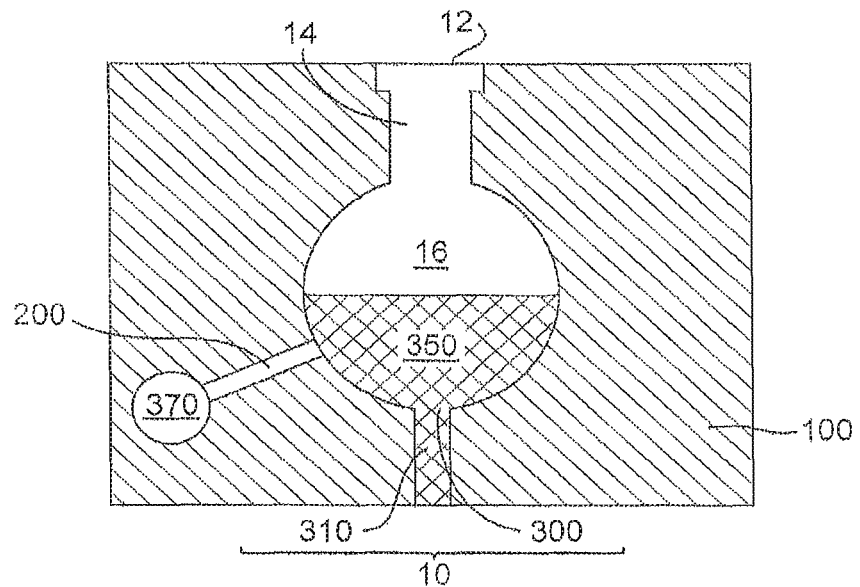

A further active embodiment is illustrated in FIG. 17. The embodiment of FIG. 17 is the same as that as FIG. 16 except as described below. In the embodiment of FIG. 17 a thermal conditioning fluid passageway 370 is provided in the support body 100. A fluid flows through the thermal conditioning fluid passageway 370 to maintain the temperature of the support body 100 (and optionally object (e.g. substrate) supported by the object table) substantially constant. The fluid flowing through the thermal conditioning fluid passageway 370 is a thermally conditioned fluid. The liquid channel 200 is provided between the thermal conditioning fluid passageway 370 and the channel 16 thereby to bring the thermal conditioning fluid passageway 370 into fluid communication with the channel 16. In this way fluid may be supplied from the thermal conditioning fluid passageway 370 to the channel 16. This may or may not be done under the control of a controller, such as controller 500, for example using a pump and/or valve.

The embodiments of FIGS. 16 and 17 are active solutions for keeping liquid present at substantially all times in the channel 16. The embodiments of FIGS. 18-26 are passive solutions which do not require active control.

Figure 18:
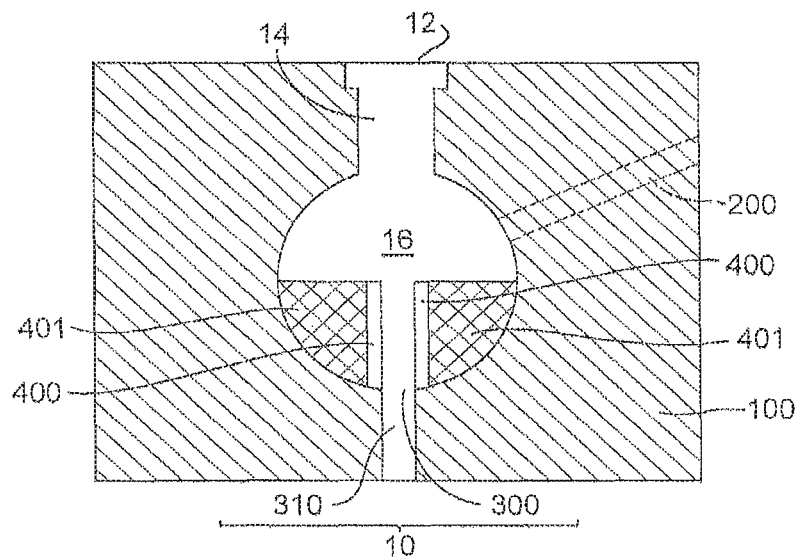

The embodiment of FIG. 18 is the same as the embodiment of FIG. 16 except as described below. As with all the embodiments of FIGS. 18-26 a liquid channel 200 such as illustrated in FIG. 16 or FIG. 17 may or may not be provided. Any combination of features from all embodiments may be combined in a single embodiment. For example the features of the embodiments of FIGS. 17 and 20 and/or 21 may be combined in a single example.

In the embodiments of FIGS. 18-26 a liquid retainer is provided in the channel 16 to retain liquid in the channel 16. The liquid retainer may take any form. The function of the liquid retainer is to substantially prevent liquid from leaving the channel 16 through the opening 300 in the channel 16. In an embodiment the liquid retainer comprises of one or more members, or a surface finish, such as a coating or a surface roughness.

In an embodiment the liquid retainer forms a reservoir of liquid in the channel 16. Only liquid which flows over the top of the reservoir is extracted through opening 300. The embodiments of FIGS. 18, 21, 22 and 24-26 can be seen as forming a reservoir for liquid in the channel 16. Liquid sits in the reservoir under gravity.

Generally the embodiments in which the liquid retainer forms a reservoir of liquid comprises one or more indentations defined in or on one or more projections or elements present at a bottom of the channel 16 and/or comprises one or more projections or elements at least partly blocking passage of liquid along the channel 16 in the direction in which the channel 16 is elongate. The channel 16 is elongate in and out of the page in FIGS. 18-26. The channel 16 is generally elongate along the edge of the object (e.g. substrate) holder 30, in plan.

An indentation may, for example, be in the form of a groove. A projection may be in the form of a barrier, typically formed from material in which the channel 16 is defined. An element may be a separate member to the material in which the channel is defined, for example glued or otherwise attached to the material in which the channel 16 is defined.

In an embodiment liquid is held in the channel 16 by capillary action or by being absorbed or by another force such as surface tension. The embodiments of FIGS. 19, 20, 23 and 24 can be seen as such examples.

The embodiments in which liquid is held by capillary action may comprise a liquid retainer formed by one or more indentations defined in or on one or more projections or elements present at a side wall of the channel 16 and/or at a bottom of the channel 16. In some embodiments the one or more features are also defined in a top wall of the channel 16.

FIG. 18 shows an embodiment in which a liquid retainer 400 is one or more indentations defined in or on one or more projections present at a bottom of the channel 16. The liquid retainer 400 forms a reservoir 401 of liquid in the channel 16. In an embodiment the liquid retainer 400 comprises one or more upwardly extending members. In an embodiment the upwardly extending member is at least partly surrounding, in plan, an opening 300 of the channel 16 through which liquid in the channel 16 is extracted. In the case that the opening 300 is circular in plan, the liquid retainer 400 may also be circular, in plan. However, the liquid retainer 400 may be any shape so long as it surrounds the opening 300. In an embodiment the liquid retainer 400 surrounds the opening 300 and extends into the channel 16. In this way a barrier is formed in a way similar to a dam. Liquid in the reservoir 401 held by the dam can only enter the opening 300 by passing over the top of the liquid retainer 400 and thereby into the opening 300. In this way liquid is substantially always maintained in the channel 16.

Figure 19:
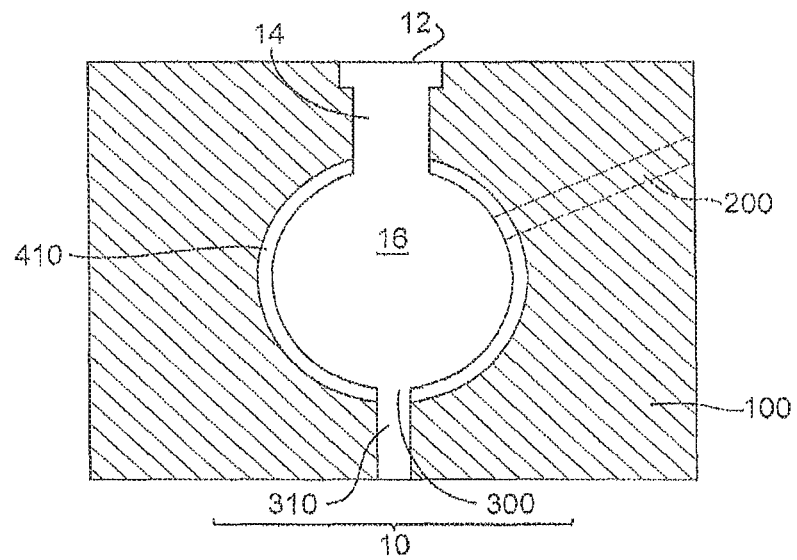

The embodiment of FIG. 19 is the same as that of FIG. 18 except as described below. In the embodiment of FIG. 19 the liquid retainer takes the form of a liquid retainer 410 formed by at least one element defined on or present at a side wall of the channel 16. In an embodiment, such as illustrated in FIG. 19, the element of the liquid retainer is additionally or alternatively defined on or present at top and/or bottom walls of the channel 16.

In an embodiment the liquid retainer 410 comprises a liquid absorbent material. In an embodiment the liquid retainer 410 is a sponge or a fabric or a string or a mesh. In an embodiment the liquid retainer 410 comprises a plurality of capillary passages. The liquid retainer 410 may be attached to the side wall of the channel 16, for example by glue. An advantage of the arrangement of FIG. 19 is that sloshing of liquid in the channel 16 is reduced or minimized because the free surface area of liquid in the channel is small. That is, capillary pressure of the liquid/gas meniscus in pockets of the material of the liquid retainer 410 will help prevent sloshing of the liquid. There may also be large viscous coupling between the object table WT and the liquid. In an embodiment the liquid retainer 410 extends along substantially the whole length of the channel 16 in the elongate direction of the channel. In an embodiment the liquid retainer 410 extends along only part of the channel 16, in its elongate direction.

Figure 20:
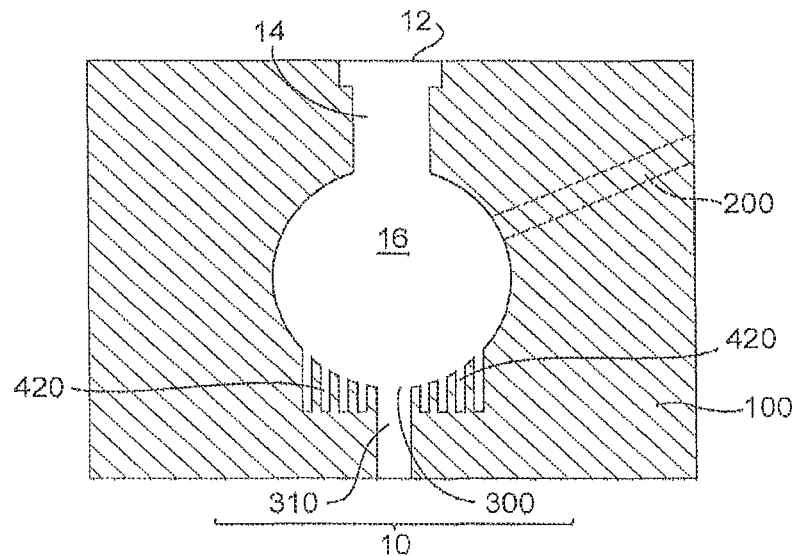

The embodiment of FIG. 20 is the same as that of FIG. 18 except as described below. In the embodiment of FIG. 20 the liquid retainer comprises one or more indentations defined on, or one or more projections or elements present at, the bottom of the channel 16. In an embodiment, such as illustrated in FIG. 20, the liquid retainer comprises at least one groove 420. In an embodiment the groove 420 is in a bottom surface of the channel 16. In an embodiment the size of the groove 420 is such that it is a capillary groove. That is, the groove 420 holds liquid in it under capillary force. The liquid is held in the groove 420 by capillary force even while the object table WT is being moved. As a result, less disturbance force results from the presence of the liquid in the groove 420, leading to lower overlay error. In an embodiment the groove 420 has a width of between 20 and 600 μm, for example between 50 and 200 μm, for example 100 μm which is a good size for manufacturability and performance.

In an embodiment the groove 420 is between 50 and 500 μm deep, for example 100 μm deep. The size and number of grooves 420 can be varied. The number and size of grooves 420 may be determined in order to optimize viscous coupling between the liquid and the object table WT. The dimensions of the groove 420 may be optimized for meniscus pinning at the top edges of the groove 420 (for example the groove 420 has one or more sharp corners). In an embodiment the length of the groove 420 in the elongate direction and the number of grooves 420 is such that a sufficient area of liquid is exposed to the channel 16 to help ensure enough evaporation of liquid to achieve the desired stability in heat load. In an embodiment the groove 420 is substantially parallel to the flow direction of liquid/gas. In an embodiment the groove 420 is substantially perpendicular to the flow direction of the liquid/gas.

Figure 21:
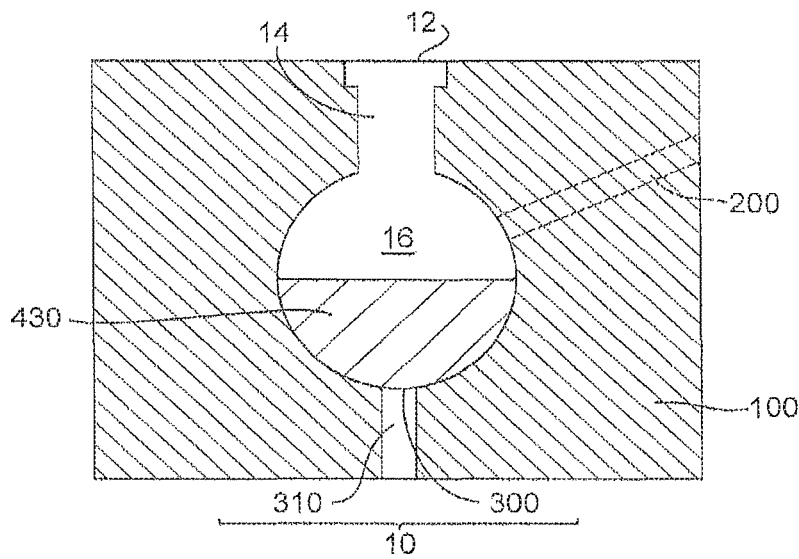

The embodiment of FIG. 21 is the same as that of FIG. 18 except as described below. In the embodiment of FIG. 21 the liquid retainer comprises one or more indentations defined on, or one or more projections or elements present at, the bottom of the channel 16. In this case the liquid retainer 430 takes the form of one or more projections or elements at least partly blocking passage of liquid along the channel 16 in a direction in which the channel 16 is elongate. That is, flow of liquid is blocked in a direction substantially perpendicular to the direction in which liquid flow is blocked in the FIG. 18 embodiment. Therefore, between adjacent openings 300 in the channel 16, there is at least one liquid retainer 430 to block passage of liquid along the bottom of the channel 16 in a direction in which the channel is elongate. Therefore, a reservoir of liquid is formed between two liquid retainers 430, one liquid retainer 430 being on either side of an opening 300. Only when liquid flows over the top of a liquid retainer 430 can that liquid be extracted through the opening 300. Thus, in the embodiment of FIG. 21 the liquid retainer comprises one or more projections or elements at least partly blocking passage of liquid along the channel in a direction in which the channel is elongate. The liquid retainer may therefore be seen as a barrier. In the embodiment of FIG. 21 the barrier does not completely block the channel 16 in its elongate direction. In an embodiment the bottom of the channel 16 is blocked by the barrier. The barrier may be made of any material, desirably one resistant to the liquid. In an embodiment the barrier is made of the same material as the material in which the channel 16 is defined. In an embodiment, the barrier is a plastic or a metal (e.g. stainless steel), or a ceramic or a glass ceramic.

In an embodiment the barrier is liquid impervious and thereby prevents liquid flowing through it. In an embodiment the barrier is semi-permeable to liquid in the channel 16. Therefore, the barrier contains liquid itself (rather like the embodiment of FIG. 19).

Figure 22:
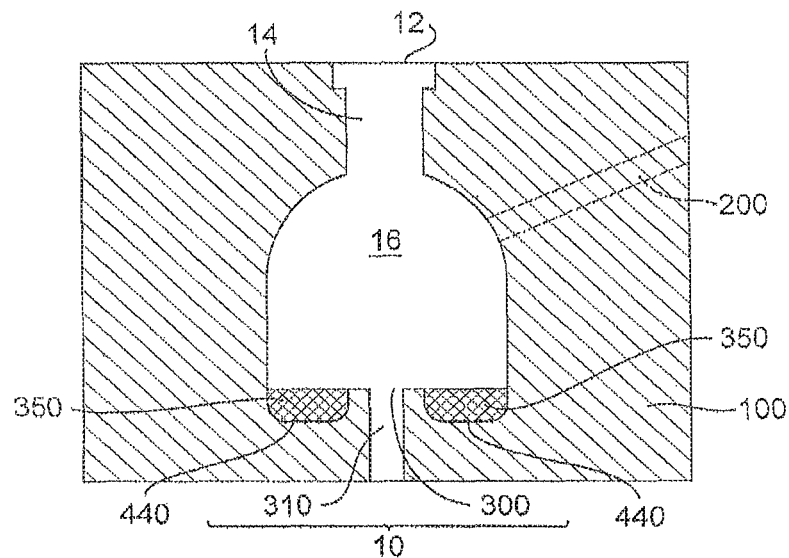

The embodiment of FIG. 22 is similar to the embodiment of FIG. 18. The differences are now described. A difference is that the liquid retainer may be seen as being in the form of a groove 440 rather than a projection 400 as in FIG. 18. The groove 440 may be seen as a small gutter or a bucket forming a reservoir 350 of liquid. The width of the groove 440 may be of the order of 1 mm. The groove 440 may extend along the entire length of the channel 16 in the elongate direction of the channel 16 or may be located at multiple discrete locations. In an embodiment, the groove 420 is between 50 and 500 µm deep, for example 100 µm deep.

Figure 23:
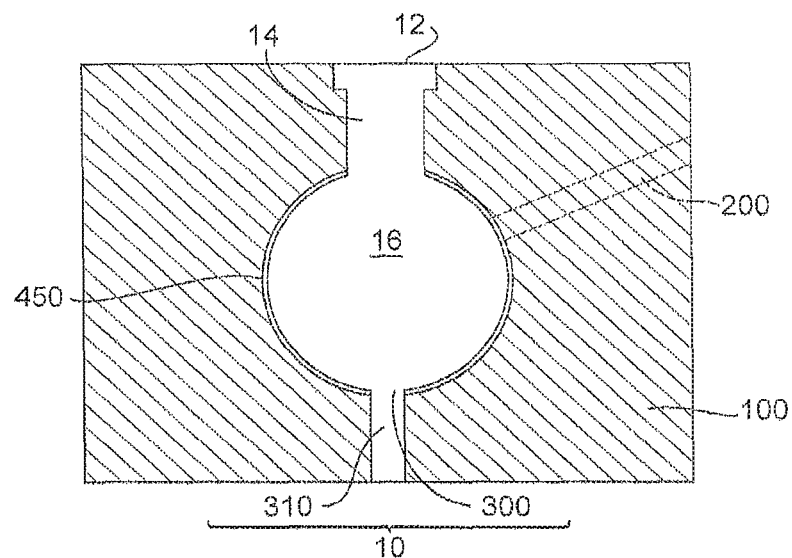

The embodiment of FIG. 23 is the same as that of FIG. 19 except as described below. In the embodiment of FIG. 23, the liquid retainer, instead of being in the form of a material which absorbs liquid, is in the form of a surface finish 450. The surface finish 450 is a surface finish of the material of the support body 100 or a coating on the material of the support body 100. In an embodiment the surface finish 450 is such that it attracts liquid. In an embodiment the surface finish is a coating. In an embodiment the coating is a lyophilic coating. This attracts liquid such that liquid sticks to the side wall and/or top wall and/or bottom wall of the channel 16. The liquid may have a contact angle with the coating of less than 30 degrees, for example.

In an embodiment the surface finish 450 is a roughening of the side wall and/or top wall and/or bottom wall of the channel 16. A rough surface of the wall attracts liquid and makes it less likely to flow out of the opening 300. The roughness Ra of the surface finish 450 may be 10 µm or greater. In an embodiment the roughness is 0.5 to 1 mm. In an embodiment the roughness may be seen as one or more grooves in the wall(s) of the channel 16, e.g. like a screw thread. Liquid is retained in such a groove.

Figure 24:
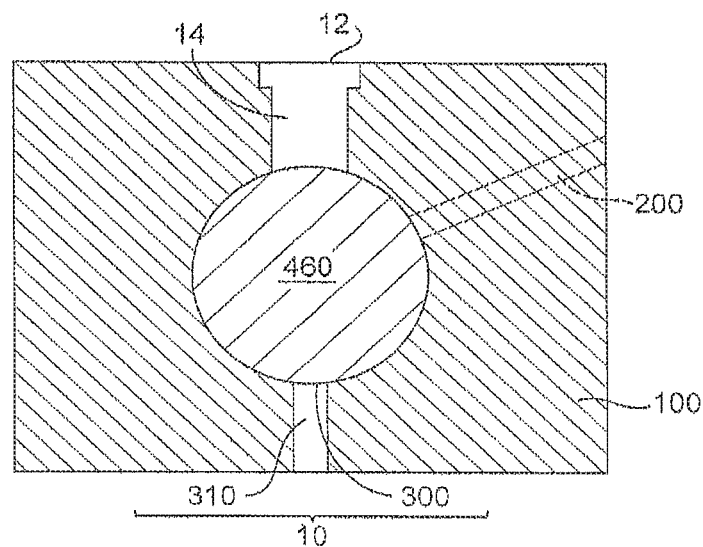

The embodiment of FIG. 24 is the same as that of FIG. 21 except as described below. In the embodiment of FIG. 24 the liquid retainer is in the form of a barrier 460 blocking the passage of liquid along the channel 16 in a direction in which the channel 16 is elongate. That is, flow of liquid is blocked in a direction substantially perpendicular to the direction in which liquid flow is blocked in the FIG. 18 embodiment. In the embodiment of FIG. 24 the liquid retainer is in the form of a barrier 460 which is semi-permeable to liquid. In contrast, in the embodiment of FIG. 21 the barrier is impermeable to liquid. Additionally, in contrast to the embodiment of FIG. 21, the barrier in the FIG. 24 embodiment may block the entire channel 16, in cross-section. Suitable materials are the same as those described with reference to FIG. 19, particularly a mesh. Therefore, the barrier 460 works by holding liquid in it in the same way as the liquid retainer 410 of the FIG. 19 embodiment and/or by forming a reservoir between barriers 460 as in the embodiment of FIG. 21.

Figure 25:
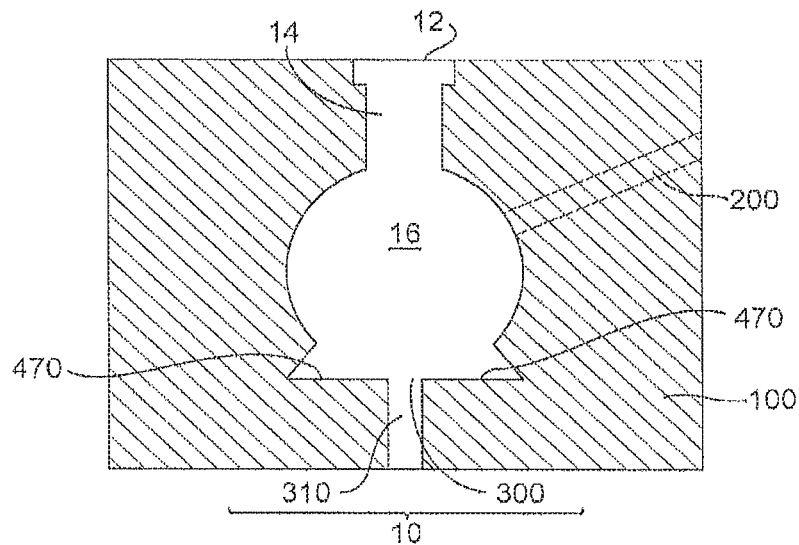

The embodiment of FIG. 25 is the same as that of FIG. 18 except as described below. In the embodiment of FIG. 25 the liquid retainer comprises one or more indentations defined on the bottom of the channel 16. In the embodiment of FIG. 25 the indentation results in a substantially flat bottom 470 of the channel 16. In an embodiment the opening 300 is formed in the flat bottom 470 of the channel 16. Because the passage of liquid towards the opening 300 is not aided by gravity, due to the flat bottom 470 of the channel 16, in the embodiment of FIG. 25 it is more likely that liquid will spend time at the bottom of the channel 16 on the substantially flat surface 470 than in other embodiments. Therefore, continuous presence of liquid in the channel 16 is more likely.

Figure 26:
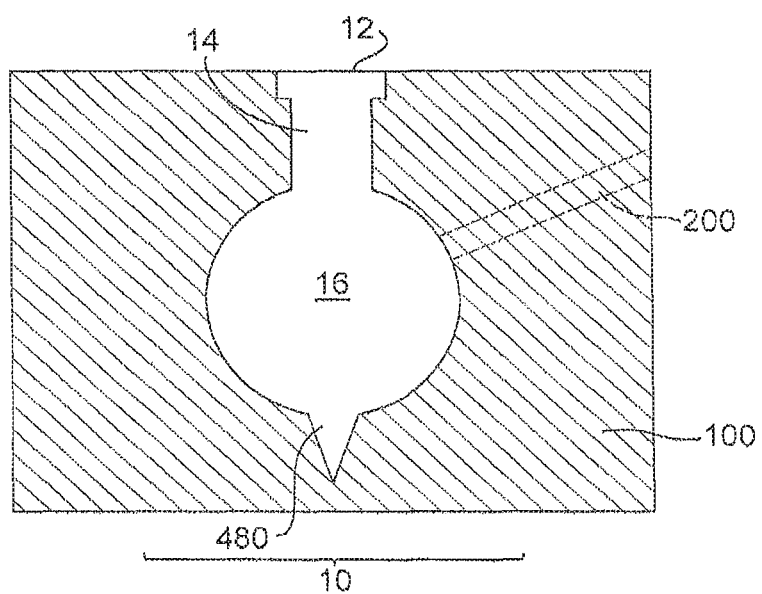

The embodiment of FIG. 26 is the same as that of FIG. 18 except as described below. In the embodiment of FIG. 26 the liquid retainer is formed in the bottom of the channel 16. The liquid retainer is in the form of a groove 480. The groove 480 has a bottom which is lower than the opening (not illustrated) of the channel 16 through which liquid in the channel is extracted. Therefore, the groove 480 forms a reservoir of liquid. In an embodiment the groove 480 extends along the elongate direction of the channel 16 between two discrete openings 300 which are distant from one another in the elongate direction of the channel 16. The groove 480 does not extend right up to the opening 300 so that there is material between the groove 480 and the passageway 310 so that the opening 300 may be defined at a level higher than the bottom of the groove 480. As a result, liquid in the groove 480 will not be extracted. Liquid will only be extracted once it is at a level higher than the opening 300. The dimensions of the groove 480 in an embodiment are similar to the dimensions of the grooves 440 of the embodiment of FIG. 22.

In an embodiment, there is provided an object table to support an object, the object table comprising: a support body comprising an object holder to hold an object; an opening adjacent an edge of the object holder; and a channel in fluid communication with the opening via a passageway, wherein the channel is defined by a first material which is different to a second material defining the passageway.

In an embodiment, the first material has a different thermal conductivity to the second material. In an embodiment, the thermal conductivity of the first material is at least an order of magnitude larger than that of the second material. In an embodiment, the thermal conductivity of the first material is at least 500 W/mK, at least 800 W/mK, or at least 1000 W/mK. In an embodiment, the first material is pyrolytic graphite or industrial diamond. In an embodiment, the first material has a different coefficient of thermal expansion to the second material. In an embodiment, the coefficient of thermal expansion of the first material is at least an order of magnitude less than that of the second material. In an embodiment, the first material is a glass-ceramic. In an embodiment, the first material is an aluminosilicate glass-ceramic or cordierite. In an embodiment, the coefficient of thermal expansion of the first material is less than or equal to $1\times10^{-6}$/K, less than or equal to $0.5\times10^{-6}$/K, less than or equal to $0.25\times10^{-6}$/K or less than or equal to $100\times10^{-9}$/K. In an embodiment, the thermal conductivity of the first material is at least an order of magnitude lower than that of the second material or at least two orders of magnitude lower than that of the second material. In an embodiment, the first material is a glass or a polymer. In an embodiment, the first material is at least one selected from: PTFE, HDPE, PP, PVC, rubber, and/or cork. In an embodiment, the thermal conductivity of the first material is less than or equal to 10 W/mK, less than or equal to 5 W/mK, less than or equal to 2 W/mK or less than or equal to 1 W/mK. In an embodiment, the Young's Modulus of the first material is less than or equal to $100\times10^9$ Pa or less than or equal to $50\times10^9$ Pa. In an embodiment, the object table further comprises a thermal barrier between the first and second materials. In an embodiment, the object table further comprises a mechanical barrier which substantially mechanically decouples the first material from the support body. In an embodiment, the thermal barrier and/or mechanical barrier comprises a gap. In an embodiment, the gap is filled with a gas or a vacuum. In an embodiment, the thermal barrier and/or mechanical barrier is a glue. In an embodiment, the thermal barrier and/or mechanical barrier is radially inward of the channel. In an embodiment, the thermal barrier and/or mechanical barrier is above the channel. In an embodiment, the first material is a coating. In an embodiment, the first material forms a self-supporting structural element of the object table. In an embodiment, the first material is supported by a structural element of the object table. In an embodiment, the structural element supporting the first material is made of the second material. In an embodiment, the first material defines at least part of a top of the channel. In an embodiment, the first material defines at least part of a radially inner part of the channel. In an embodiment, the first material defines at least part of a radially outer part of the channel. In an embodiment, the first material defines at least part of a bottom part of the channel. In an embodiment, the support body and/or object holder is comprised of the second material. In an embodiment, the second material comprises at least one material selected from: siliconized silicon carbide, silicon carbide, quartz, and/or aluminum nitride. In an embodiment, the object table further comprises a further opening adjacent an edge of the substrate holder; and a further channel in fluid communication with the further opening via a further passageway. In an embodiment, the opening is radially inward of a position of an edge of a substrate on the substrate holder. In an embodiment, the opening is radially outward of a position of an edge of a substrate on the substrate holder. In an embodiment, the channel is connected to an under pressure source. In an embodiment, the object table further comprises a heater and/or sensor adjacent the channel. In an embodiment, the heater and/or sensor is coupled to the first material. In an embodiment, different properties of the first material compared to the second material result, during use, in a lower thermal load and/or a lower thermal deformation load being applied to the support body than if the first and second material were the same. In an embodiment, the second material defines a surface of the passageway. In an embodiment, the first material defines a surface of the channel. In an embodiment, the object table further comprises a coating on the first material which defines a surface of the channel. In an embodiment, the first material is joined to the second material with glue. In an embodiment, the object table further comprises a liquid channel in fluid communication with the channel independently to supply liquid to the channel. In an embodiment, the object table further comprises a thermal conditioning fluid passageway in the support body. In an embodiment, the liquid channel is in fluid communication with the thermal conditioning fluid passageway to supply fluid from the thermal conditioning fluid passageway to the liquid channel. In an embodiment, the object table further comprises a controller configured to control extraction of liquid from the channel so as to retain liquid in the channel. In an embodiment, the object table further comprises a liquid retainer in the channel to retain liquid in the channel. In an embodiment, the liquid retainer comprises an indentation defined on, or a projection or element present at, a bottom of the channel. In an embodiment, the liquid retainer comprises an indentation defined on, or a projection or element present at, a side wall of the channel. In an embodiment, the liquid retainer comprises a projection or element at least partly blocking passage of liquid along the channel in a direction in which the channel is elongate.

In an embodiment, there is provided an object table to support an object, the object table comprising: a support body comprising an object holder to hold an object; a channel in fluid communication with an opening which is adjacent an edge of the object holder and extending along at least part of an outer edge of the object holder; and a liquid retainer in the channel to retain liquid in the channel, the liquid retainer comprising an indentation defined on, or a projection or element present at, a bottom of the channel.

In an embodiment, the liquid retainer forms a reservoir of liquid in the channel. In an embodiment, the liquid retainer comprises a groove in a bottom surface of the channel. In an embodiment, the groove is a capillary groove. In an embodiment, the capillary groove has a width of between 20 and 600 μm or between 50 and 200 μm. In an embodiment, the bottom of the groove, in use, is lower than an opening of the channel through which liquid in the channel is extracted. In an embodiment, the liquid retainer comprises an upwardly extending member at least partly surrounding an opening of the channel through which liquid in the channel is extracted. In an embodiment, the liquid retainer comprises a substantially flat bottom of the channel and the object table further comprises an opening in the flat bottom of the channel through which liquid in the channel is extracted.

In an embodiment, there is provided an object table to support an object, the object table comprising: a support body comprising an object holder to hold an object; a channel in fluid communication with an opening which is adjacent an edge of the object holder and extending along at least part of an outer edge of the object holder; and a liquid retainer in the channel to retain liquid in the channel, the liquid retainer comprising a projection or element at least partly blocking passage of liquid along the channel in a direction in which the channel is elongate.

In an embodiment, the liquid retainer comprises a barrier in the channel blocking the passage of liquid along the channel in a direction in which the channel is elongate. In an embodiment, the barrier extends only partly up the channel so as to allow liquid to flow over the barrier once the liquid reaches the level of the barrier and thereby allow flow of liquid along the channel. In an embodiment, the barrier blocks the whole cross section of the channel. In an embodiment, the barrier prevents liquid flowing through it. In an embodiment, the barrier is semi-permeable to liquid in the channel.

In an embodiment, there is provided an object table to support an object, the object table comprising: a support body comprising an object holder to hold an object; a channel in fluid communication with an opening which is adjacent an edge of the object holder and extending along at least part of an outer edge of the object holder; and a liquid retainer in the channel to retain liquid in the channel, the liquid retainer comprising an indentation defined on, or a projection or element present at, a side wall of the channel.

In an embodiment, the liquid retainer comprises a liquid absorbent material. In an embodiment, the liquid retainer comprises a plurality of capillary passages. In an embodiment, the liquid retainer is attached to at least part of the side wall of the channel. In an embodiment, the liquid retainer comprises a coating or a rough surface of the side wall. In an embodiment, the coating is a lyophillic coating or the side wall has a roughness Ra of greater than 10 μm or between 0.5 and 1 mm. In an embodiment, the liquid has a contact angle with the coating of less than 30 degrees. In an embodiment, the liquid retainer is additionally defined on or present at a top and/or bottom wall of the channel. In an embodiment, the object table is a substrate table. In an embodiment, the object holder is a substrate holder to hold a substrate. In an embodiment, the object table further comprises a liquid supply device configured to independently actively supply a fluid to the channel.

In an embodiment, there is provided a lithographic apparatus comprising an object table as described herein.

In an embodiment, there is provided a method of operating an immersion lithographic apparatus, comprising: providing a liquid onto an object supported by a table; and removing liquid from an edge of the object through an opening in fluid communication with a channel via a passageway, wherein the channel is defined by a first material which is different to a second material which defines the passageway.

In an embodiment, there is provided a method of operating an immersion lithographic apparatus, comprising: providing a liquid onto an object supported by a table; and removing liquid from an edge of the object through a channel which extends along at least part of an edge of the object, wherein liquid is provided to the channel from a thermal conditioning fluid passageway in the table.

In an embodiment, there is provided a method of operating an immersion lithographic apparatus, comprising: providing a liquid onto an object supported by a table; and removing liquid from an edge of the object through a channel which extends along at least part of an edge of the object, wherein liquid is retained in the channel by an indentation defined on, or a projection or element present at, a bottom of the channel.

In an embodiment, there is provided a method of operating an immersion lithographic apparatus, comprising: providing a liquid onto an object supported by a table; and removing liquid from an edge of the object through a channel which extends along at least part of an edge of the object, wherein liquid is retained in the channel by a projection or element at least partly blocking passage of liquid along the channel in a direction in which the channel is elongate.

In an embodiment, there is provided a method of operating an immersion lithographic apparatus, comprising: providing a liquid onto an object supported by a table; and removing liquid from an edge of the object through a channel which extends along at least part of an edge of the object, wherein liquid is retained in the channel by an indentation defined on, or a projection or element present at, a side wall of the channel.

Although specific reference may be made in this text to the use of lithographic apparatus in the manufacture of ICs, it should be understood that the lithographic apparatus described herein may have other applications in manufacturing components with microscale, or even nanoscale, features, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains one or multiple processed layers.

The terms "radiation" and "beam" used herein encompass all types of electromagnetic radiation, including ultraviolet (UV) radiation (e.g. having a wavelength of or about 436, 405, 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage media for storing such computer programs, and/or hardware to receive such media. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A moveable substrate table to support a substrate, the substrate table comprising:
   a support body having a support surface configured to hold the substrate on the substrate table;
   an opening adjacent an edge of the support surface; and
   a channel attached to the support body and in fluid communication with the opening via a passageway, wherein the channel is at least essentially thermally decoupled from the support body and from the passageway so that a thermal load in material defining the channel is essentially prevented from being transmitted to the support body and to the passageway.

2. The substrate table of claim 1, wherein the channel is defined by a first material which is different to a second material defining the passageway.

3. The substrate table of claim 1, wherein the channel is at least essentially thermally decoupled from the support body and from the passageway by a thermal barrier between the channel and the support body.

4. The substrate table of claim 3, wherein the thermal barrier comprises glue and/or an open gap between a structure of the channel and the support body.

5. The substrate table of claim 1, further comprising a barrier that substantially mechanically decouples material defining the channel from the support body and the passageway.

6. The substrate table of claim 1, wherein the channel is formed in a separate body from the support body.

7. The substrate table of claim 1, further comprising a heater or a sensor adjacent the channel.

8. A lithographic apparatus, comprising:
   the substrate table of claim 1;
   a projection system configured to project a radiation beam onto a substrate supported by the substrate table; and
   a liquid confinement structure configured to supply and at least partly confine a liquid to a space between the projection system and the substrate table.

9. A moveable substrate table to support a substrate, the substrate table comprising:
   a support body having a support surface configured to hold the substrate on the substrate table;
   an opening adjacent an edge of the support surface;
   a channel in fluid communication with the opening via a passageway, the channel in a fixed position relative to the passageway; and
   a barrier that essentially mechanically decouples the material defining the channel from the support body and the passageway.

10. The substrate table of claim 9, wherein the channel is defined by a first material which is different to a second material defining the passageway.

11. The substrate table of claim 9, further comprising a thermal barrier between the channel and the support body.

12. The substrate table of claim 9, wherein the barrier comprises glue and/or an open gap.

13. The substrate table of claim 9, wherein the channel is formed in a separate body from the support body.

14. The substrate table of claim 9, wherein barrier is located at a vertical extending surface of the structure defining the channel.

15. The substrate table of claim 9, further comprising a heater or a sensor adjacent the channel.

16. A lithographic apparatus, comprising:
   the substrate table of claim 1;
   a pattern transfer system configured to transfer a pattern onto a substrate supported by the substrate table; and
   a liquid confinement structure configured to supply and at least partly confine a liquid to a space between the pattern transfer system and the substrate table.

17. A method of operating an immersion lithographic apparatus, the method comprising:
   providing a liquid onto an object supported by a table;
   removing liquid from an edge of the object through an opening in fluid communication with a channel attached to the table, via a passageway, wherein the channel is at least essentially thermally decoupled from the support body and from the passageway so that a thermal load in material defining the channel is essentially prevented from being transmitted to the support body and to the passageway.

18. The method of claim 17, wherein the channel is defined by a first material which is different to a second material defining the passageway.

19. The method of claim 17, wherein the channel is at least essentially thermally decoupled from the support body and from the passageway by a thermal barrier between the channel and the support body.

20. The method of claim 17, further comprising substantially mechanically decoupling material defining the channel from the support body and the passageway using a barrier.

* * * * *